United States Patent
Kimura et al.

(10) Patent No.: US 11,677,005 B2
(45) Date of Patent: Jun. 13, 2023

(54) SEMICONDUCTOR DEVICE AND METHOD FOR MANUFACTURING THE SAME

(71) Applicant: KABUSHIKI KAISHA TOYOTA CHUO KENKYUSHO, Nagakute (JP)

(72) Inventors: Taishi Kimura, Nagakute (JP); Daisuke Nakamura, Nagakute (JP); Tetsuo Narita, Nagakute (JP); Keita Kataoka, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 334 days.

(21) Appl. No.: 16/962,922

(22) PCT Filed: Feb. 19, 2019

(86) PCT No.: PCT/JP2019/006058
§ 371 (c)(1),
(2) Date: Jul. 17, 2020

(87) PCT Pub. No.: WO2019/176470
PCT Pub. Date: Sep. 19, 2019

(65) Prior Publication Data
US 2021/0134962 A1    May 6, 2021

(30) Foreign Application Priority Data
Mar. 14, 2018    (JP) .............................. JP2018-046361

(51) Int. Cl.
*H01L 29/20*    (2006.01)
*H01L 21/02*    (2006.01)
*H01L 29/06*    (2006.01)

(52) U.S. Cl.
CPC ...... *H01L 29/2003* (2013.01); *H01L 21/0254* (2013.01); *H01L 21/0262* (2013.01); *H01L 29/0619* (2013.01)

(58) Field of Classification Search
CPC ......... H01L 21/02576; H01L 21/02579; H01L 29/207; H01L 29/66204; H01L 29/66212;
(Continued)

(56) References Cited

U.S. PATENT DOCUMENTS 6,136,093 A    10/2000   Shiomi et al.
6,436,193 B1   8/2002    Kasai et al.
(Continued)

FOREIGN PATENT DOCUMENTS

JP    H08-157295 A    6/1996
JP    2000-290777 A   10/2000
(Continued)

OTHER PUBLICATIONS

P.G. Baranov et al. "Current Status of GaN Crystal Growth by Sublimation Sandwich Technique". MRS Internet Journal of Nitride Semiconductor Research, vol. 3, article 50, 1998.
(Continued)

*Primary Examiner* — Julia Slutsker
(74) *Attorney, Agent, or Firm* — Oliff PLC

(57) ABSTRACT

A semiconductor device includes: a substrate; and an n-type layer including a nitride semiconductor formed on the surface of the substrate. In the n-type layer, the concentration of donor impurities (excluding O) is $1 \times 10^{15}$ cm$^{-3}$ or more and $1 \times 10^{20}$ cm$^{-3}$ or less, the concentration of C impurities is $1 \times 10^{16}$ cm$^{-3}$ or less, the concentration of O impurities is $1 \times 10^{16}$ cm$^{-3}$ or less, the concentration of Ca impurities is $1 \times 10^{16}$ cm$^{-3}$ or less, and the sum total of the concentrations of the C impurities, the O impurities, and the Ca impurities is lower than the concentration of the donor impurities. Such a semiconductor device can be fabricated by using a halogen-free vapor phase epitaxy (HF-VPE) device.

13 Claims, 7 Drawing Sheets

(58) Field of Classification Search
CPC ............... H01L 29/66734; H01L 29/78; H01L 29/7813; H01L 29/861; H01L 29/868; H01L 29/872
See application file for complete search history.

(56) References Cited

U.S. PATENT DOCUMENTS

| | | | |
|---|---|---|---|
| 2008/0042160 | A1 | 2/2008 | Shibata |
| 2011/0180213 | A1 | 7/2011 | Hirayama et al. |
| 2012/0329245 | A1 | 12/2012 | Uematsu et al. |
| 2013/0011677 | A1 | 1/2013 | Nambu et al. |

FOREIGN PATENT DOCUMENTS

| | | | |
|---|---|---|---|
| JP | 2002-060297 | A | 2/2002 |
| JP | 2006-027976 | A | 2/2006 |
| JP | 2007-277089 | A | 10/2007 |
| JP | 2008-044818 | A | 2/2008 |
| JP | 2009-302205 | A | 12/2009 |
| JP | 2013-227202 | A | 11/2013 |
| JP | 2014-073918 | A | 4/2014 |
| JP | 2014-075606 | A | 4/2014 |
| JP | 2016-104693 | A | 6/2016 |
| JP | 2016-128381 | A | 7/2016 |
| JP | 2017-183583 | A | 10/2017 |

OTHER PUBLICATIONS

C.M. Balkas et al. "Growth and Characterization of GaN Single Crystals". Journal of Crystal Growth, vol. 208, 2000, pp. 100-106.
Mamoru Imade et al. "Examination of Effects of H2 Concentration in Reactant Gas on GaN Growth by Gallium Hydride Vapor Phase Epitaxy". Japanese Journal of Applied Physics, vol. 45, No. 33, 2006, pp. L878-L880.
H.-J. Rost et al. "Investigations of the Growth Conditions for GaN-Bulk Crystals Grown by the Sublimation Technique". Phys. Stat. Sol., vol. 4, No. 7, 2007, pp. 2219-2222.
G. Lukin et al. "Investigation of GaN Layers Grown by High Temperature Vapor Phase Epitaxy". Phys. Status Solidi. C., vol. 11, No. 3-4, 2014, pp. 491-494.
May 1, 2018 International Search Report issued in International Patent Application No. PCT/JP2018/004436.
May 1, 2018 Written Opinion of the International Searching Authority issued in International Patent Application No. PCT/JP2018/004436.
Feb. 19, 2019 Written Opinion of the International Preliminary Examining Authority issued in International Patent Application No. PCT/JP2018/004436.
Apr. 2, 2019 Office Action issued in Japanese Patent Application No. 2017-023660.
May 28, 2019 Office Action issued in Japanese Patent Application No. 2017-023660.
May 15, 2019 International Preliminary Report on Patentability issued in International Patent Application No. PCT/JP2018/004436.
May 28, 2019 International Search Report issued in International Patent Application No. PCT/JP2019/006058.
May 28, 2019 Written Opinion issued in International Patent Application No. PCT/JP2019/006058.
Jun. 30, 2020 Office Action issued in Japanese Patent Application No. 2018-046361.
Sep. 15, 2020 International Preliminary Report on Patentability issued in International Patent Application No. PCT/JP2019/006058.
U.S. Appl. No. 16/344,455, filed Apr. 24, 2019 in the name of Taishi Kimura et al.
Mar. 15, 2021 Office Action issued in U.S. Appl. No. 16/344,455.
Nov. 27, 2020 Office Action issued in U.S. Appl. No. 16/344,455.

SEMICONDUCTOR DEVICE AND METHOD FOR MANUFACTURING THE SAME

FIELD OF THE INVENTION

The present invention relates to a semiconductor device and a method for manufacturing the same, and more particularly relates to a semiconductor device using a nitride semiconductor such as a Schottky barrier diode, a p-n junction diode, a pin diode, or a metal oxide semiconductor field effect transistor (MOSFET), and to a method for manufacturing the same.

BACKGROUND OF THE INVENTION

Nitride semiconductors such as GaN or AlN have characteristics such as a larger band gap and a higher breakdown voltage than conventional semiconductors. Hence, the nitride semiconductors are expected to be applied to power semiconductor devices.

In such semiconductor devices, it is necessary to provide an n-type drift layer of a low donor concentration (up to $1 \times 10^{17}$ cm$^{-3}$) in order to improve the breakdown voltage when a reverse bias is applied. However, when an n-type drift layer is formed by a conventional method, the n-type drift layer is inevitably contaminated with impurities such as C, O, or Ca derived from the growth method. C and Ca act as compensation acceptors for a nitride semiconductor, while O acts as a donor. Hence, conventional growth methods have a drawback that it is difficult to fabricate a low-concentration n-type drift layer having a concentration as designed.

Consider, for example, obtaining a free electron concentration of $1 \times 10^{17}$ cm$^{-3}$ using Si impurities (donors) in an n-type drift layer composed of a nitride semiconductor. Assuming that the activation rate of the Si impurities is 100%, and the Si impurities are doped at $1 \times 10^{17}$ cm$^{-3}$. Furthermore, in order to simplify the discussion, the activation rate of other impurities is assumed to also be 100%.

In this case, for example, when the C impurities are present at $5 \times 10^{16}$ cm$^{-3}$, the free electron concentration is then estimated to be $5 \times 10^{16}$ cm$^{-3}$ ($= 1 \times 10^{17}$ cm$^{-3}$ $- 5 \times 10^{16}$ cm$^{-3}$) due to the compensation effect. In addition, when the O impurities are present at $5 \times 10^{16}$ cm$^{-3}$, the O impurities then act as unintentional donor impurities and therefore the free electron concentration is then estimated to be $1.5 \times 10^{17}$ cm$^{-3}$ ($= 1 \times 10^{17}$ cm$^{-3}$ $+ 5 \times 10^{16}$ cm$^{-3}$). Hence, an n-type drift layer having a free electron concentration as designed is not obtained.

In order to solve this problem, various methods have been conventionally proposed.

For example, Patent Literature 1 discloses a nitride semiconductor substrate including a drift layer in which:

(a) a concentration $N_D$ of donor is equal to or greater than a concentration $N_A$ of carbon acting as an acceptor, and (b) the difference between $N_D$ and $N_A$ gradually decreases from the substrate side toward the surface side of the drift layer.

Patent Literature 1 describes that, in cases where metal organic chemical vapor deposition (MOCVD) is used to form a drift layer composed of n-type GaN, (A) when the flow rate of the donor raw material (monosilane gas) is gradually reduced, the concentration $N_D$ of donor can be gradually reduced in the lamination direction, and (B) by adjusting the flow rate of group-III organometallic raw material (trimethyl gallium (TMG)), the ratio of the flow rate of group-V raw material (ammonia) to the TMG flow rate, and the growth temperature, and the like, the concentration $N_D$ of donor is then at least a ⅓ multiple of the concentration $N_C$ of total carbon.

When using MOCVD to form a drift layer composed of n-type GaN, organometallic compounds such as TMG are used as the group-III raw materials. Hence, the drift layer is inevitably contaminated with C impurities (compensation acceptors). In order to solve the foregoing problem, Patent Literature 1 discloses a method for controlling the balance between $N_D$ and $N_A$ by controlling the growth conditions. However, the method is not a fundamental solution for controlling the free electron concentration in the drift layer. Furthermore, when the drift layer growth conditions are intentionally or unintentionally changed, the C impurity concentration in the drift layer changes and the desired free electron concentration and structure will likely no longer be obtained.

In addition, C impurities contaminated in the nitride semiconductor form an impurity level, which may deteriorate the crystalline properties of the nitride semiconductor layer. For example, such a nitride semiconductor layer has the problem that its optical characteristics, breakdown voltage, and so forth are lower than those of a nitride semiconductor layer not contaminated with C impurities.

On the other hand, in order to avoid contamination with C impurities, it is also possible to adopt a growth method that does not use organometallic compounds. Known growth methods of this kind are, for example, hydride vapor phase epitaxy (HVPE) and molecular beam epitaxy (MBE), or the like.

When GaN is grown using HVPE, because gallium chloride is used as the raw material, the growing crystal is not contaminated with C impurities. However, the growing crystal is contaminated with O impurities due to auto-doping from the quartz constituting the reaction vessel.

Furthermore, in the case of HVPE, p-type nitride semiconductors cannot be fabricated and therefore a p-n junction cannot be formed without exposure to the atmosphere. Conventionally, in cases where p-n junctions, which are often used in electronic devices, have been fabricated, when an n-type layer has been grown and then exposed to the atmosphere and a p-type layer has subsequently been formed, the segregation of Si (concentration of about $5 \times 10^{18}$ cm$^{-3}$) and the segregation of Ca (concentration of about $1 \times 10^{16}$ cm$^{-3}$) have been confirmed at the interface between the n-type layer and p-type layer. Hence, in order to fabricate a favorable p-n junction, it is necessary to grow an n-type layer and then, without exposure to the atmosphere, continuously grow a p-type layer. In the case of HYPE, because it is difficult to grow a p-n junction layer continuously, the only p-n junction that can be manufactured is a p-n junction that includes an Si segregation region and/or a Ca segregation region at the interface between the p-type layer and n-type layer.

Meanwhile, in the case of MBE, both a p-type layer and an n-type layer can be grown, and contamination with C and O impurities is minimal. However, it is known that the growing crystal is sometimes contaminated with Ca impurities from the crucible or the like. Furthermore, the MBE has an extremely slow growth rate of about several hundred nm/h. Therefore, it is not realistic to grow, for example, a thick drift layer (of about 10 μm) composed of GaN, which is required for manufacturing a power device having a breakdown voltage of about 1000 V, by the MBE from the viewpoint of growth time and so forth.

CITATION LIST

Patent Literature

Patent Literature 1: Japanese Unexamined Patent Application Publication No. 2017-183583.

SUMMARY OF THE INVENTION

The problem to be solved by the present invention is to provide a semiconductor device including an n-type layer that is composed of a nitride semiconductor and contains relatively few impurities acting as compensation acceptors or unintentional donors, and a method for manufacturing the semiconductor device.

Further, another problem to be solved by the present invention is to provide a semiconductor device that includes a p-n junction including a nitride semiconductor and that does not include an Si segregation region and/or a Ca segregation region at an interface between a p-type layer and an n-type layer, and a method for manufacturing the semiconductor device.

Furthermore, another problem to be solved by the present invention is to provide a semiconductor device that includes an n-type drift layer having a high breakdown voltage, and a method for manufacturing the semiconductor device.

In order to solve the foregoing problems, the semiconductor device according to the present invention is characterized by comprising the following configuration.
(1) The semiconductor device includes:
    a substrate; and
    an n-type layer including a nitride semiconductor (A) formed on the surface of the substrate.
(2) In the n-type layer,
    the concentration of donor impurities (excluding O) is $1 \times 10^{15}$ cm$^{-3}$ or more and $1 \times 10^{20}$ cm$^{-3}$ or less,
    the concentration of C impurities is $1 \times 10^{16}$ cm$^{-3}$ or less,
    the concentration of O impurities is $1 \times 10^{16}$ cm$^{-3}$ or less,
    the concentration of Ca impurities is $1 \times 10^{16}$ cm$^{-3}$ or less, and
    the sum total of the concentrations of the C impurities, the O impurities, and the Ca impurities is lower than the concentration of the donor impurities.

The semiconductor device according to the present invention may further comprises the following configuration.
(3) The semiconductor device further includes:
    a p-type layer formed adjacent to an upper surface or a lower surface of the n-type layer,
    wherein the p-type layer includes a nitride semiconductor (C) of the same type as or of a different type from the nitride semiconductor (A) constituting the n-type layer, and in which
    the concentration of acceptor impurities (excluding C and Ca) is $1 \times 10^{15}$ cm$^{-3}$ or more and $1 \times 10^{20}$ cm$^{-3}$ or less;
    the concentration of C impurities is $1 \times 10^{16}$ cm$^{-3}$ or less;
    the concentration of O impurities is $1 \times 10^{16}$ cm$^{-3}$ or less;
    the concentration of Ca impurities is $1 \times 10^{16}$ cm$^{-3}$ or less; and
    the sum total of the concentrations of the C impurities, the O impurities, and the Ca impurities is lower than the concentration of the acceptor impurities.
(4) The surface of the n-type layer on the p-type layer side does not include an Si segregation region in which the Si concentration is two times or more the Si concentration in the n-type layer.
(5) The surface of the n-type layer on the p-type layer side does not include a Ca segregation region in which the Ca concentration is $1 \times 10^{16}$ cm$^{-3}$ or more.

Furthermore, the semiconductor device may further comprise an i-type layer formed between the n-type layer and the p-type layer.

The method for manufacturing the semiconductor device according to the present invention comprises the following configuration.
(1) The method for manufacturing a semiconductor device includes:
    a first step of using a halogen-free vapor phase epitaxy (HF-VPE) device and forming, on a substrate surface, either:
    (a) an n-type layer including a nitride semiconductor (A) in which the concentration of donor impurities (excluding O) is $1 \times 10^{15}$ cm$^{-3}$ or more and $1 \times 10^{20}$ cm$^{-3}$ or less; the concentration of C impurities is $1 \times 10^{16}$ cm$^{-3}$ or less; the concentration of O impurities is $1 \times 10^{16}$ cm$^{-3}$ or less; the concentration of Ca impurities is $1 \times 10^{16}$ cm$^{-3}$ or less; and the sum total of the concentrations of the C impurities, the O impurities, and the Ca impurities is lower than the concentration of the donor impurities, or
    (b) a p-type layer including a nitride semiconductor (C) of the same type as or of a different type from the nitride semiconductor (A) constituting the n-type layer and in which the concentration of acceptor impurities (excluding C and Ca) is $1 \times 10^{15}$ cm$^{-3}$ or more and $1 \times 10^{20}$ cm$^{-3}$ or less; the concentration of C impurities is $1 \times 10^{16}$ cm$^{-3}$ or less; the concentration of O impurities is $1 \times 10^{16}$ cm$^{-3}$ or less; the concentration of Ca impurities is $1 \times 10^{16}$ cm$^{-3}$ or less; and the sum total of the concentrations of the C impurities, the O impurities, and the Ca impurities is lower than the concentration of the acceptor impurities; and
    a second step of also forming, in the HF-VPE device, the p-type layer or the n-type layer on the surface of the substrate on which the n-type layer or the p-type layer has been formed, continuously and without exposing the substrate to the atmosphere.
(2) The HF-VPE device includes:
    a crystal growth section having a susceptor to hold the substrate;
    a gas supply section to supply a metal-contained gas (a gas containing a metal vapor) generated from a metal source and a reactant gas, which reacts with the metal-contained gas to form an inorganic compound, toward the substrate; and
    a heating section having a heating unit to heat the substrate and the metal source.
(3) The gas supply section includes:
    a first crucible disposed separately from the susceptor and holding the metal source;
    a carrier gas supply unit that supplies a carrier gas into the first crucible, and supplies a mixed gas of the metal-contained gas and the carrier gas toward the substrate; and
    a reactant gas supply unit to supply the reactant gas toward the substrate.
(4) A porous baffle plate is provided in the opening of the first crucible.

The method for manufacturing the semiconductor device according to the present invention may further include a third step of forming an i-type layer between the first and second steps.

The HF-VPE device according to the present invention does not substantially cause any contamination of the growing crystal with C, O, or Ca impurities. Further, both a p-type layer and an n-type layer can be grown continuously without exposure to the atmosphere. Moreover, high-speed growth of at least 10 μm/h is possible.

Hence, by using the HF-VPE device, it is possible to fabricate:

(a) a semiconductor device including an n-type layer (drift layer) in which the concentration of donor impurities is relatively low and the concentration of C, O, and Ca impurities is lower than conventionally;

(b) a semiconductor device including a p-n junction that does not include an Si segregation region and/or a Ca segregation region at an interface between a p-type layer and an n-type layer, or (c) a semiconductor device including an n-type layer (drift layer) with a high breakdown voltage.

DETAILED DESCRIPTION OF PREFERRED EMBODIMENTS

Figure 1:
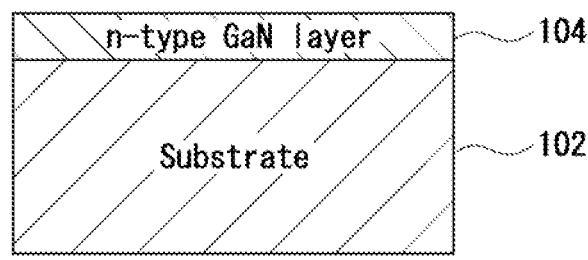
FIG. 1 is a cross-sectional schematic diagram of a semiconductor device according to a first embodiment of the present invention.

One embodiment of the present invention will be described in detail hereinbelow.

[1. Semiconductor Device]

The semiconductor device according to the present invention has the following configuration.

(1) The semiconductor device includes:
  a substrate; and
  an n-type layer including a nitride semiconductor (A) formed on the surface of the substrate.

(2) In the n-type layer,
  the concentration of donor impurities (excluding O) is $1 \times 10^{15}$ cm$^{-3}$ or more and $1 \times 10^{20}$ cm$^{-3}$ or less,
  the concentration of C impurities is $1 \times 10^{16}$ cm$^{-3}$ or less,
  the concentration of O impurities is $1 \times 10^{16}$ cm$^{-3}$ or less,
  the concentration of Ca impurities is $1 \times 10^{16}$ cm$^{-3}$ or less, and
  the sum total of the concentrations of the C impurities, the O impurities, and the Ca impurities is lower than the concentration of the donor impurities.

The semiconductor device may further include:

(a) a p-type layer formed adjacent to an upper surface or a lower surface of the n-type layer, or (b) an i-type layer formed between the n-type layer and p-type layer.

[1.1. Substrate]

The substrate serves to support the n-type layer, and the p-type layer and the i-type layer that are formed adjacent to the n-type layer. In the present invention, the material of the substrate is not particularly limited, and an optimum material can be selected according to the purpose. Examples of the material of the substrate include, (a) sapphire, (b) SiC, and (c) a nitride semiconductor (B) of the same type as or a different type from the nitride semiconductor (A) constituting the n-type layer.

The most preferable substrate for a power device is a substrate that is composed of the nitride semiconductor (B) of the same type as the nitride semiconductor (A) constituting the n-type layer and has a higher donor concentration than the n-type layer. This is because, among other reasons:

(a) the use of such a substrate allows current to flow in a longitudinal direction of the substrate, so that the current density can be raised by about one order of magnitude in comparison with a device in which current flows in a lateral direction, and (b) the use of such a substrate suppresses the formation of misfit dislocations, which is formed by using a substrate composed of a material different from that of the n-type layer, and enables the production of the n-type layer with a high crystallinity and a low dislocation density.

The nitride semiconductor (B) constituting the substrate is particularly preferably GaN. This is because:

(a) since the concentration of impurities in GaN can be easily controlled, a substrate having high conductivity can be manufactured, and (b) since such a substrate has no (or minimal) lattice constant mismatch with the n-type layer composed of the nitride semiconductor (A), ideal device characteristics can be obtained as compared with the case of using a substrate composed of other material. Details of the nitride semiconductors will be described later.

[1.2. n-Type Layer (Drift Layer)]

[1.2.1. Nitride Semiconductor (A)]

The n-type layer includes the nitride semiconductor (A). "Nitride semiconductor" refers to a semiconductor that includes a compound of a group-III element (Ga, Al, In, or the like), and nitrogen. Examples of the nitride semiconductors (A) include GaN, InN, AlN, BN, BGaN, BInN, BAlN, InGaN, AlGaN, InAlN, InAlGaN, BInAlN, BAlGaN, BInGaN, or BInAlGaN, or the like.

Nitride semiconductor (A) is particularly preferably GaN. This is because the drift layer using GaN does not cause the difference in lattice constant with a GaN substrate suitable as a power device substrate, and thus it is possible to grow the drift layer with a low dislocation density and a high crystallinity on the substrate. Furthermore, GaN has a comparatively large band gap in comparison with other materials, and the impurity concentration of the n-type layer can be controlled in a wide range. Accordingly, the use of GaN as the drift layer increases the degree of freedom in designing breakdown voltage and on-resistance of the power device.

[1.2.2. Donor Impurities]

[A. Type]

The n-type layer includes donor impurities. Examples of the donor impurities include Si, Ge, and O, or the like. The n-type layer may include any one of the donor impurities or may include two or more of the donor impurities.

The donor impurities are particularly preferably Si and/or Ge. This is because both Si and Ge enable concentrations to be controlled in a wide range.

Note that, although O acts as a donor for nitride semiconductor (A), O is excluded from the "donors" as defined herein. This is because O is an impurity derived from the growth method and is difficult to control and because, when O is included in GaN at a high concentration, degradation in crystallinity is induced by the strain on the lattice.

[B. Donor Impurity Concentration]

The donor impurity concentration of the n-type layer affects the electrical characteristics of the semiconductor device. The donor impurity concentration of the n-type layer that is to be used is determined according to the role of the n-type layer in the semiconductor device. In order to obtain the function as an n-type layer, the donor impurity concentration of the n-type layer must be $1 \times 10^{14}$ cm$^{-3}$ or more. The donor impurity concentration is preferably $1 \times 10^{15}$ cm$^{-3}$ or more.

For example, as an n-type layer 104a in FIG. 4 described later, an n-type layer that includes donor impurities of about $1 \times 10^{18}$ cm$^{-3}$ or more and $1 \times 10^{20}$ cm$^{-3}$ or less is used. Further, in order to obtain the ohmic characteristics with an electrode, for example, the donor impurity concentration of the n-type layer is preferably higher and preferably $1 \times 10^{20}$ cm$^{-3}$ or more.

The semiconductor device may include a single n-type layer in which the donor impurity concentration is substantially equal or may include a plurality of n-type layers of different donor impurity concentrations. For example, when the semiconductor device is a p-n junction diode or a pin diode, the n-type layer may include:

(a) an n-type layer (A) (electron injection layer) that includes a nitride semiconductor (A) in which the donor impurity concentration is $1 \times 10^{17}$ cm$^{-3}$ or more and $1 \times 10^{19}$ cm$^{-3}$ or less; and (b) an n-type layer (B) (breakdown voltage holding layer) that includes a nitride semiconductor (A), formed adjacent to an upper surface or a lower surface of the n-type layer (A), in which the donor impurity concentration is $1 \times 10^{15}$ cm$^{-3}$ or more and $1 \times 10^{18}$ cm$^{-3}$ or less.

In this case, the p-type layer is formed adjacent to the n-type layer (B).

[1.2.3. C, O, and Ca Impurities]

O impurities act as donors of the nitride semiconductor (A). On the other hand, C and Ca impurities both act as compensation acceptors of the nitride semiconductor (A). These are both impurities derived from the growth method and the contamination amount of which is difficult to control. Furthermore, when a conventional growth method is used, contamination with relatively large amounts of C, O, and/or Ca readily occurs.

In contrast, when the method described later is used, it is possible to obtain an n-type layer in which the amount of contamination with C, O, and Ca impurities is minimal.

Specifically, by using the method described later, the concentration of C impurities can be reduced to $1 \times 10^{16}$ cm$^{-3}$ or less. When the growth conditions are optimized, the concentration of C impurities can be further reduced to $1 \times 10^{14}$ cm$^{-3}$ or less, or $5 \times 10^{13}$ cm$^{-3}$ or less.

Likewise, by using the method described later, the concentration of O impurities can be reduced to $1 \times 10^{16}$ cm$^{-3}$ or less. When the growth conditions are optimized, the concentration of O impurities can be further reduced to $1 \times 10^{14}$ cm$^{-3}$ or less, or $5 \times 10^{13}$ cm$^{-3}$ or less.

Likewise, by using the method described later, the concentration of Ca impurities can be reduced to $1 \times 10^{16}$ cm$^{-3}$ or less. When the growth conditions are optimized, the concentration of Ca impurities can be further reduced to $1 \times 10^{14}$ cm$^{-3}$ or less.

Furthermore, by using the method described later, the sum total of the concentrations of the C impurities, the O impurities, and the Ca impurities can be reduced to a concentration lower than the concentration of donor impurities.

[1.2.4. Thickness]

When a reverse bias voltage is applied, the majority of the depletion layer is formed in the n-type drift layer region. Therefore, the thickness of the n-type drift layer is an important parameter for deciding the breakdown voltage of the semiconductor device. The trade-off relationship between the on-resistance and the breakdown voltage of the semiconductor device is expressed by the following formula (1).

$$R_{onA} = 4V_B^2/\varepsilon E^3 \mu \quad (1)$$

Here, $R_{onA}$ denotes the on-resistance, $V_B$ denotes the breakdown voltage, $\varepsilon$ denotes the dielectric constant intrinsic to the material of the semiconductor layer, $\mu$ denotes the electron (or hole) mobility of the semiconductor layer, and E denotes the breakdown field intrinsic to the material of the semiconductor layer. Thus, the breakdown voltage and on-resistance have a trade-off relationship. By making the thickness of the drift layer thin or making the donor impurity concentration of the drift layer high, the on-resistance can be lowered but, at the same time, the breakdown voltage is then low. Therefore, when the n-type drift layer is too thin, the breakdown voltage upon applying the reverse bias may decrease. Hence, considering that the breakdown voltage typically expected for a nitride power device is about 300 to 1200 V, the thickness of the n-type layer is preferably 3 μm or more. The thickness of the n-type layer is preferably 5 μm or more and more preferably 10 μm or more.

[1.3. p-Type Layer]

The semiconductor device may further include a p-type layer formed adjacent to the upper surface or lower surface of the n-type layer. That is, the semiconductor device may include a p-n junction.

[1.3.1. Nitride Semiconductor (C)]

The p-type layer includes a nitride semiconductor (C) of the same type as or of a different type from the nitride semiconductor (A) constituting the n-type layer. Nitride semiconductor (C) is particularly preferably GaN. Because the other features relating to the nitride semiconductor (C) are the same as those of nitride semiconductor (A), a description of such features is omitted.

[1.3.2. Acceptor Impurities]

[A. Type]

The p-type layer includes acceptor impurities. Examples of acceptor impurities include Mg, C, Ca, and Zn, or the like. The p-type layer may include any one of the acceptor impurities or may include two or more of the acceptor impurities.

The acceptor impurities are particularly preferably Mg. This is because the activation rate of Mg in GaN is high in comparison with the other acceptor impurities, and the concentration of Mg can be controlled over a wide range.

Note that, although C and Ca act as acceptors of nitride semiconductor (C), C and Ca are excluded from the "acceptors" as defined herein. This is because C and Ca are impurities derived from the growth method, are difficult to control, and have a low activation rate as an acceptor.

[B. Acceptor Impurity Concentration]

The acceptor impurity concentration of the p-type layer affects the electrical characteristics of the semiconductor device. The acceptor impurity concentration of the p-type layer to be used is determined according to the role of the p-type layer in the semiconductor device. In order to obtain the function as a p-type layer, the acceptor impurity concentration of the p-type layer must be $1\times10^{14}$ cm$^{-3}$ or more. The acceptor impurity concentration is preferably $1\times10^{15}$ cm$^{-3}$ or more.

For example, as a p-type layer (B) 106b in FIG. 5 described later, a p-type layer that includes acceptor impurities of about $1\times10^{18}$ cm$^{-3}$ or more and $1\times10^{20}$ cm$^{-3}$ or less is used. Further, in order to obtain the ohmic characteristics with an electrode, for example, the acceptor impurity concentration of the p-type layer is preferably higher and preferably $1\times10^{20}$ cm$^{-3}$ or more.

Furthermore, when the p-type layer is also grown by using HF-VPE described later, it is possible to obtain a p-type layer in which the amount of contamination with C, O, and Ca impurities is minimal.

Specifically, by using the method described later, the concentration of C impurities can be reduced to $1\times10^{16}$ cm$^{-3}$ or less. When the growth conditions are optimized, the concentration of C impurities can be further reduced to $1\times10^{14}$ cm$^{-3}$ or less, or $5\times10^{13}$ cm$^{-3}$ or less.

Likewise, by using the method described later, the concentration of O impurities can be reduced to $1\times10^{16}$ cm$^{-3}$ or less. When the growth conditions are optimized, the concentration of O impurities can be further reduced to $1\times10^{14}$ cm$^{-3}$ or less, or $5\times10^{13}$ cm$^{-3}$ or less.

Likewise, by using the method described later, the concentration of Ca impurities can be reduced to $1\times10^{16}$ cm$^{-3}$ or less. When the growth conditions are optimized, the concentration of Ca impurities can be further reduced to $1\times10^{14}$ cm$^{-3}$ or less.

Furthermore, by using the method described later, the sum total of the concentrations of the C impurities, O impurities, and Ca impurities can be reduced to the concentration lower than the concentration of acceptor impurities.

[1.3.3. Segregation]

[A. Si Segregation Region]

"Si segregation region" denotes a region that is formed at the interface between the n-type layer and the p-type layer and in which region the Si concentration is two times or more of the concentration of the Si in the n-type layer.

In cases where the p-type layer is formed after forming the n-type layer, an Si segregation region is sometimes formed on the surface of the n-type layer when the surface of the n-type layer is exposed to the atmosphere. Furthermore, this phenomenon is also similarly confirmed in cases where, after forming the p-type layer, the surface of the p-type layer is exposed to the atmosphere before forming the n-type layer.

The semiconductor device according to the present invention is fabricated by using a halogen-free vapor phase epitaxy (HF-VPE) device as described later. The HF-VPE device is capable of growing the n-type layer and p-type layer continuously without exposure to the atmosphere. Hence, the semiconductor device according to the present invention does not include an Si segregation region at the interface between the n-type layer and p-type layer (or the p-type layer and n-type layer).

[B. Ca Segregation Region]

"Ca segregation region" denotes a region that is formed at the interface between the n-type layer and the p-type layer and in which region the Ca concentration is $1\times10^{16}$ cm$^{-3}$ or more.

As mentioned above, the n-type layer according to the present invention has a Ca impurity concentration of $1\times10^{16}$ cm$^{-3}$ or less. However, in cases where a p-type layer is also formed after forming the n-type layer, a Ca segregation region is sometimes formed on the surface of the n-type layer when the surface of the n-type layer is exposed to the atmosphere. This phenomenon is similarly confirmed in cases where, after forming the p-type layer, the surface of the p-type layer is exposed to the atmosphere before forming the n-type layer.

Because the semiconductor device according to the present invention is manufactured by using an HF-VPE device, the n-type layer and p-type layer can be grown continuously without exposure to the atmosphere. Hence, the semiconductor device according to the present invention does not include a Ca segregation region at the interface between the n-type layer and p-type layer.

[1.3.4. Thickness]

The thickness of the p-type layer is not particularly limited, and the optimum thickness can be selected according to the purpose. For example, for the purpose of obtaining contact with an electrode (p-type layer (A) 106a in FIG. 5), the thickness of the p-type layer may be several tens nm to several hundred nm. Furthermore, the thickness of channel portion (p-type layer (B) 106b in FIG. 5) of the MOSFET is determined in a range of several tens nm to several μm according to the desired characteristics of the MOSFET.

[1.4. i-Type Layer]

The semiconductor device may further include an i-type layer formed between the n-type layer and p-type layer. That is, the semiconductor device may include a pin junction.

[1.4.1. Nitride Semiconductor (D)]

The i-type layer includes a nitride semiconductor (D) of the same type as or of a different type from the nitride semiconductor (A) constituting the n-type layer. Nitride semiconductor (D) is particularly preferably GaN. This is because the concentration of impurities in GaN can be easily controlled and hence the i-type layer can be easily fabricated using GaN, and such a i-type layer has no (or minimal) lattice constant mismatch with GaN which is easily used for other nitride semiconductor layers (A, B, and C, for example).

Because the other features relating to the nitride semiconductor (D) are the same as those of the nitride semiconductor (A), a description of such features is omitted.

[1.4.2. Donor Impurities and Acceptor Impurities]

In the present invention, "i-type layer" denotes a layer in which the donor impurity concentration is at least two orders lower than that of the n-type layer and in which the acceptor impurity concentration is at least two orders lower than that of the p-type layer.

The i-type layer is ideally a layer of an intrinsic semiconductor that does not include intentionally added donor impurities or acceptor impurities. However, because it is sometimes difficult in practice to form an i-type layer including an intrinsic semiconductor, a layer doped with donor impurities or acceptor impurities of about $1\times10^{15}$ cm$^{-3}$ to $1\times10^{17}$ cm$^{-3}$ may also be used instead of the i-type layer including the intrinsic semiconductor.

[1.4.3. Thickness]

The thickness of the i-type layer is not particularly limited, and the optimum thickness can be selected according to the breakdown voltage and on-resistance of the semiconductor device to be used.

[1.5. Specific Examples]

[1.5.1. Specific Example 1]

FIG. 1 shows a cross-sectional schematic diagram of a semiconductor device according to a first embodiment of the present invention. In FIG. 1, a semiconductor device 100a includes a substrate 102, and an n-type layer 104 formed on the surface of the substrate 102.

In FIG. 1, a sapphire substrate, an SiC substrate, or a GaN substrate, or the like, is used as the substrate 102. Furthermore, the n-type layer 104 is an n-type GaN layer and a layer having a concentration of donor impurity and concentrations of C, O, and Ca impurities within predetermined ranges. Note that, when the semiconductor device 100a is used in various applications, electrodes and other layers (none of which are illustrated), and the like, are normally formed according to requirements.

[1.5.2. Specific Example 2]

Figure 2:
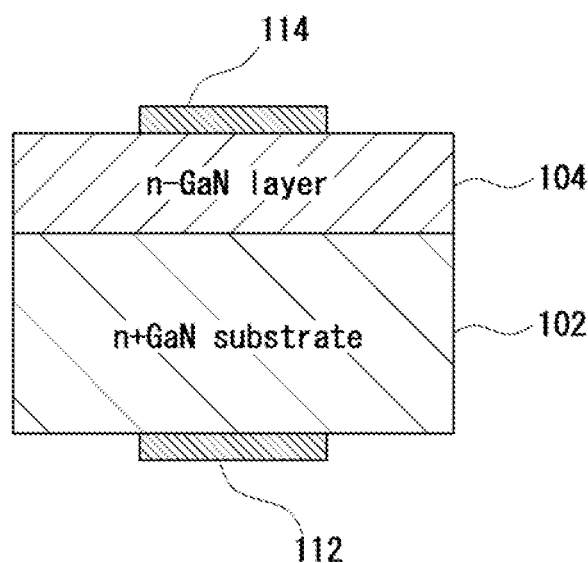
FIG. 2 is a cross-sectional schematic diagram of a semiconductor device according to a second embodiment of the present invention.

FIG. 2 shows a cross-sectional schematic diagram of a semiconductor device according to a second embodiment of the present invention. In FIG. 2, a semiconductor device 100b includes a substrate 102, and an n-type layer 104 formed on the surface of the substrate 102. A first electrode 112 is formed on the lower surface of the substrate 102, and a second electrode 114 is formed on the upper surface of the n-type layer 104.

The semiconductor device 100b illustrated in FIG. 2 is a so-called Schottky barrier diode. In FIG. 2, the substrate 102 is an n+GaN substrate. Because the lower the resistance value of the substrate 102 the better, the higher the donor concentration of the substrate 102 the better. Specifically, the donor concentration of the substrate (n+GaN substrate) 102 is preferably $5 \times 10^{18}$ cm$^{-3}$ or more.

Meanwhile, the n-type layer 104 is an n-GaN layer (drift layer). The donor concentration of the n-type layer 104 is determined according to the breakdown voltage and so forth of the Schottky barrier diode, but a commonly used concentration range is about $1 \times 10^{15}$ cm$^{-3}$ or more and $1 \times 10^{17}$ cm$^{-3}$ or less.

The first electrode 112 is formed on the lower surface of the substrate 102. The material of the first electrode 112 is not particularly limited as long as ohmic characteristics are obtained. Examples of the material of the first electrodes 112 include Ti/Al/Ni/Au, Ti/Al/Ti/Au, and Ti/Al/Mo/Au, or the like.

Furthermore, the second electrode 114 is formed on the upper surface of the n-type layer 104. The material of the second electrode 114 is not particularly limited as long as Schottky diode characteristics are obtained. Examples of the material of the second electrodes 114 include Ni/Au, Au, TiN, W, Ni, and Al, or the like.

[1.5.3. Specific Example 3]

Figure 3:
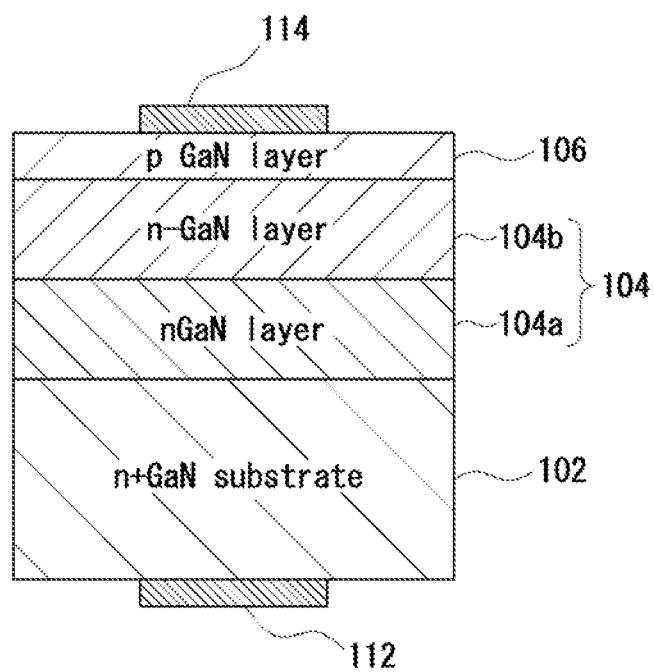
FIG. 3 is a cross-sectional schematic diagram of a semiconductor device according to a third embodiment of the present invention.

FIG. 3 shows a cross-sectional schematic diagram of a semiconductor device according to a third embodiment of the present invention. In FIG. 3, a semiconductor device 100c includes a substrate 102, an n-type layer 104 formed on the surface of the substrate 102, and a p-type layer 106 formed on the surface of the n-type layer 104. Furthermore, a first electrode 112 is formed on the lower surface of the substrate 102, and a second electrode 114 is formed on the upper surface of the p-type layer 106.

In addition, the n-type layer 104 has a dual-layer structure that includes an n-type layer (A) 104a containing high-concentration donor impurities and an n-type layer (B) 104b containing low-concentration donor impurities.

The semiconductor device 100c illustrated in FIG. 3 is a so-called p-n junction diode. In FIG. 3, the substrate 102 is an n+GaN substrate. Because the lower the resistance value of the substrate 102 the better, the higher the donor concentration of the substrate 102 the better. Specifically, the donor concentration of the substrate (n+GaN substrate) 102 is preferably $5 \times 10^{18}$ cm$^{-3}$ or more.

The n-type layer (A) 104a is an nGaN layer. The donor concentration of the n-type layer (A) 104a is selected so that the desired diode characteristics are obtained, but a commonly used concentration range is about $1 \times 10^{17}$ cm$^{-3}$ or more and $1 \times 10^{19}$ cm$^{-3}$ or less.

The n-type layer (B) 104b is an n-GaN layer (n-GaN drift layer). The donor concentration of the n-type layer (B) 104b is determined according to the breakdown voltage and so forth, but a commonly used concentration range is about $1 \times 10^{15}$ cm$^{-3}$ or more and $1 \times 10^{17}$ cm$^{-3}$ or less.

The p-type layer 106 is a pGaN layer. Regarding the p-type layer 106, a commonly used concentration range is about $1 \times 10^{17}$ cm$^{-3}$ or more and $1 \times 10^{19}$ cm$^{-3}$ or less.

Materials for the first electrode 112 and the second electrode 114 may be selected so as to obtain ohmic characteristics. Examples of the material of the first electrodes 112 include Ti/Al/Ni/Au, Ti/Al/Ti/Au, and Ti/Al/Mo/Au, or the like. In addition, examples of the material of the second electrodes 114 include Pd/Au, Ag, Pd, and Ni/Au, or the like.

[1.5.4. Specific Example 4]

Figure 4:
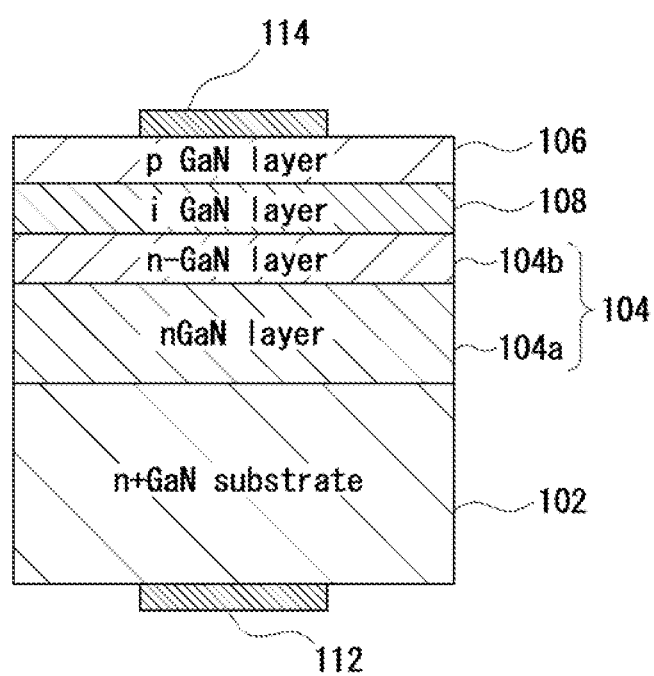
FIG. 4 is a cross-sectional schematic diagram of a semiconductor device according to a fourth embodiment of the present invention.

FIG. 4 shows a cross-sectional schematic diagram of a semiconductor device according to a fourth embodiment of the present invention. In FIG. 4, a semiconductor device 100d includes a substrate 102, an n-type layer 104 formed on the surface of the substrate 102, an i-type layer 108 formed on the surface of the n-type layer 104, and a p-type layer 106 formed on the surface of the i-type layer 108. A first electrode 112 is formed on the lower surface of the substrate 102, and a second electrode 114 is formed on the upper surface of the p-type layer 106.

The semiconductor device 100d illustrated in FIG. 4 is a so-called pin diode and is configured by inserting the i-type layer 108 between the n-type layer 104 and the p-type layer 106. In FIG. 4, an iGaN layer is used as the i-type layer 108. The i-type layer 108 of the pin diode ideally signifies an intrinsic semiconductor layer that has not been intentionally doped with impurities. As the i-type layer 108, a layer that has an extremely high resistance (the donor or acceptor impurity concentration is extremely low at about $1 \times 10^{13}$ cm$^{-3}$ to $1 \times 10^{17}$ cm$^{-3}$) is actually often used instead of the intrinsic semiconductor. Because the other features are the same as those of the semiconductor device 100c illustrated in FIG. 3, a description of such features is omitted.

[1.5.5. Specific Example 5]

Figure 5:
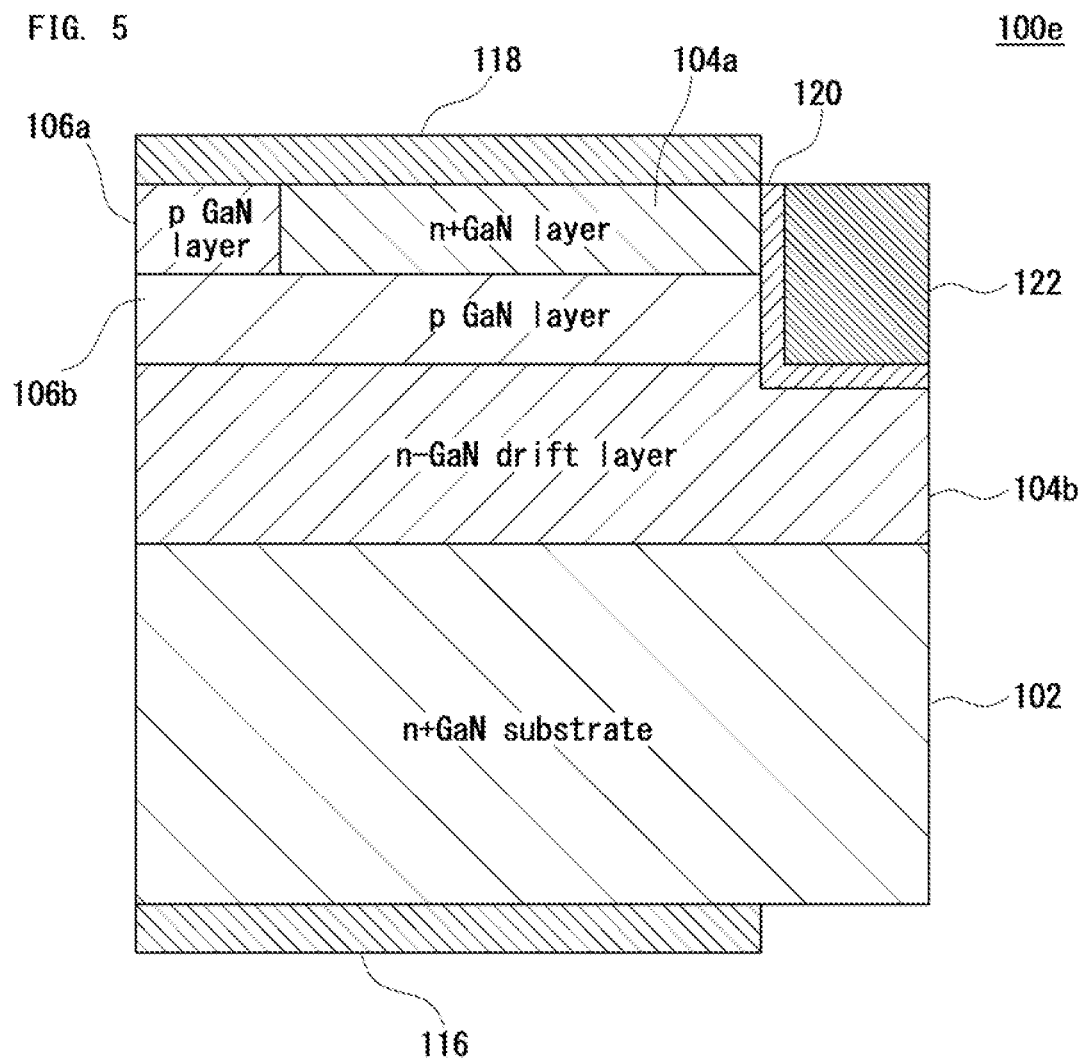
FIG. 5 is a cross-sectional schematic diagram of a semiconductor device according to a fifth embodiment of the present invention.

FIG. 5 shows a cross-sectional schematic diagram of a semiconductor device according to a fifth embodiment of the present invention. In FIG. 5, a semiconductor device 100e includes:

a substrate 102;

an n-type layer (B) 104b formed on the surface of the substrate 102;

a p-type layer (B) 106b formed on the surface of the n-type layer (B) 104b; and an n-type layer (A) 104a and a p-type layer (A) 106a formed on the surface of the p-type layer (B) 106b.

A drain electrode 116 is formed on the lower surface of the substrate 102. A source electrode 118 is formed on the upper surface of the n-type layer (A) 104a and the p-type layer (A) 106a. Furthermore, a gate electrode 122 is formed via an insulating film 120 on the upper surface of the n-type layer (B) 104(b) and on the side surfaces of the p-type layer (B) 106b and the n-type layer (A) 104a.

The semiconductor device 100e illustrated in FIG. 5 is a so-called vertical MOSFET. In FIG. 5, the substrate 102 is an n+GaN substrate. The n-type layer (B) 104b is an n-GaN drift layer. The p-type layer (B) 106b is a pGaN base layer. Normally, the donor impurity concentration of the n-GaN drift layer is configured to be lower than the acceptor impurity concentration of the pGaN base layer. Hence, when a reverse bias voltage is applied to the semiconductor device 100e, the majority of the depletion layer is formed in the n-GaN drift layer region, and hence the thicker the thickness of the n-GaN drift layer, the higher the breakdown voltage. On the other hand, because the impurity concentration of the n-GaN drift layer region is low as mentioned above, the resistance of the n-GaN drift layer is high in comparison with other regions. Hence, the thicker the thickness, the larger the on-resistance value of the semiconductor device 100e. Accordingly, the impurity concentration (the free electron concentration) of the n-GaN drift layer region and the thickness thereof are important because they determine the performance (the breakdown voltage and on-resistance) of the semiconductor device 100e.

[2. Halogen-Free Vapor Phase Epitaxy (HF-VPE) Device (1)]

Figure 6:
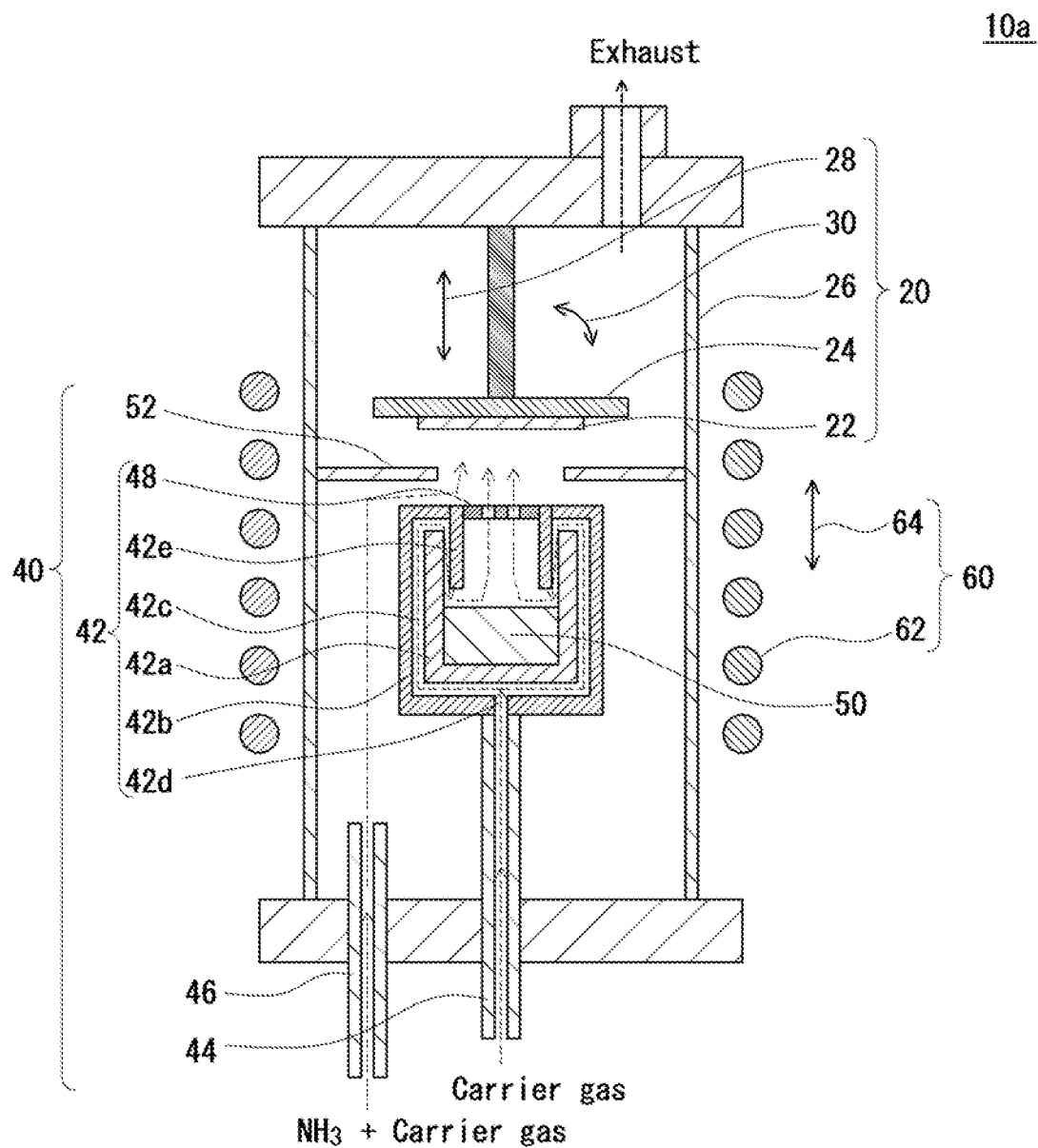
FIG. 6 is a cross-sectional schematic diagram of a halogen-free vapor phase epitaxy (HF-VPE) device according to the first embodiment of the present invention.

FIG. 6 shows a cross-sectional schematic diagram of a halogen-free vapor phase epitaxy device (hereinafter also called an "HF-VPE device") according to the first embodiment of the present invention. In FIG. 6, an HF-VPE device 10a has the following configuration.

(1) The HF-VPE device 10a includes:
a crystal growth section 20 having a susceptor 24 to hold a seed crystal 22;
a gas supply section 40 to supply a metal-contained gas (a gas containing a metal vapor) generated from a metal source 50 and a reactant gas, which reacts with the metal-contained gas to form an inorganic compound, toward the seed crystal 22; and
a heating section 60 having a heating unit 62 to heat the seed crystal 22 and the metal source 50.

(2) The gas supply section 40 include:
a first crucible 42 disposed separately from the susceptor 24 and holding the metal source 50;
a carrier gas supply unit that supplies a carrier gas into the first crucible 42, and supplies a mixed gas of the metal-contained gas and the carrier gas toward the seed crystal 22; and
a reactant gas supply unit to supply the reactant gas toward the seed crystal 22.

(3) A porous baffle plate 48 is provided in the opening of the first crucible 42.

[2.1. Crystal Growth Section]
[2.1.1. Susceptor]

The crystal growth section 20 has the susceptor 24 to hold the seed crystal 22 (that is, the substrate 102). The susceptor 24 is placed in a reaction container 26. The inner atmosphere and pressure of the reaction container 26 can be controlled using an exhaust device (not shown).

A structure of the susceptor 24 is not particularly limited, and an optimum structure can be selected according to the purpose. Material of the reaction container 26 is not particularly limited, and an optimum material can be selected according to the purpose. Examples of the reaction container 26 include a quartz chamber.

The susceptor 24 is placed at a position such that the mixed gas to be discharged through the porous baffle plate 48 can be supplied to the surface of the seed crystal 22. A positional relationship between the susceptor 24 and the first crucible 42 is not particularly limited, and an optimum positional relationship can be selected according to the structure of the first crucible 42.

In the example of FIG. 6, the susceptor 24 is disposed above the first crucible 42. The mixed gas discharged through the porous baffle plate 48 rises toward the susceptor 24.

[2.1.2. First Movable Unit]

The susceptor 24 (or the seed crystal 22) is disposed by a certain distance away from the porous baffle plate 48 (or the opening of the first crucible 42). A distance between the porous baffle plate 48 and the surface of the susceptor 24 (hereinafter also referred to as "baffle-to-susceptor distance") may be fixed or variable.

When the baffle-to-susceptor distance is fixed, a distance between the porous baffle plate 48 and the surface of the growing crystal (hereinafter also referred to as "baffle-to-growing crystal distance") decreases along with growth of the single crystal. The baffle-to-growing crystal distance is in general preferably maintained within a predetermined range to stably continue growth of the single crystal. Hence, when a thick single crystal is grown, the first movable unit 28 is preferably provided to change the vertical distance between the porous baffle plate 48 and susceptor 24.

The first movable unit 28 may be provided in one or both of the crystal growth section 20 and the gas supply section 40. That is, the first movable unit 28 may be any of:
(a) a unit that can move the susceptor 24 while the first crucible 42 is fixed,
(b) a unit that can move the first crucible 42 while the susceptor 24 is fixed, or
(c) a unit that can move both the susceptor 24 and the first crucible 42.

Temperature of each section is preferably actively controlled to stably continue growth of the single crystal. To achieve this, the first movable unit 28 is preferably capable of moving the susceptor 24.

[2.1.3. Angle Changing Unit]

The tilt angle of the surface of the seed crystal 22 may be fixed or variable. The term "the tilt angle of the surface of the seed crystal (hereinafter also simply referred to as "tilt angle")" means an angle formed by the normal direction of the surface of the seed crystal 22 and a supply direction of the mixed gas.

The mixed gas is usually supplied from the normal direction of the surface of the seed crystal 22. However, when the mixed gas is supplied from an oblique direction with respect to the surface of the seed crystal 22, the growth rate may increase. In such a case, the angle changing unit 30 to change the tilt angle is preferably provided in the crystal growth section 20.

A structure of the angle changing device 30 is not particularly limited, and the optimum structure can be selected according to the purpose. A changing range of the tilt angle is not particularly limited, and an optimum changing range can be selected according to the purpose. The tilt angle is typically 0 to 60°.

[2.2. Gas Supply Section]

The gas supply section 40 supplies a metal-contained gas and a reactant gas, which reacts with the metal-contained gas to form an inorganic compound, toward the seed crystal 22. The metal-contained gas is generated by heating the metal source 50 to a predetermined temperature.

The term "metal-contained gas" means a gas containing a metal vapor produced by evaporating a molten metal. The metal source 50 may include a metal alone or a mixture of a metal and a metal compound. When the metal source 50 contains an appropriate amount of metal compound, the growing crystal may be doped with an element contained in the metal compound.

As described above, the gas supply section 40 includes:

the first crucible 42 disposed separately from the susceptor 24 and holding the metal source 50;

the carrier gas supply unit that supplies the carrier gas into the first crucible 42, and supplies the mixed gas of the metal-contained gas and the carrier gas toward the seed crystal 22; and the reactant gas supply unit to supply the reactant gas toward the seed crystal 22.

The porous baffle plate 48 is provided in the opening of the first crucible 42.

[2.2.1. Porous Baffle Plate]

In the invention, the porous baffle plate 48 is provided in the opening of the first crucible 42. The invention is different in this point from the related art. The term "porous baffle plate" means a plate-like component having a plurality of through-holes each having a small diameter. The porous baffle plate 48 must have:

(a) a function of discharging the mixed gas from the inside to the outside of the first crucible 42; and (b) a function of suppressing backflow of reactant gas from the outside to the inside of the first crucible 42. Hence, diameters and the number of through-holes are preferably selected such that both the functions are compatible.

In general, a smaller opening area of the porous baffle plate 48 (area per through-hole×the number of through-holes) increases a flow rate (hereinafter also referred as "crucible outlet gas-flow-rate") of the mixed gas passing through the porous baffle plate 48, and thus improves a function of preventing backflow of the reactant gas. However, an excessively small opening area increases resistance to passage of the mixed gas through the porous baffle plate 48, and thus deteriorates a function of discharging the mixed gas.

An excessively high crucible outlet gas-flow-rate decreases the temperature of the porous baffle plate 48. This results in a decrease in the temperature of the metal-contained gas passing through the porous baffle plate 48, and thus metal droplets may be formed on the growing crystal. In addition, the backflow reactant gas may directly enter the first crucible 42 while being not decomposed during passage through the porous baffle plate 48, and may react with the metal source 50 in the first crucible 42.

When the porous baffle plate 48, which has a smaller hole than the diameter of the crucible, is placed at the outlet of the first crucible 42, it is possible to control the flow rate of gas at the crucible outlet and the crucible internal pressure. By raising the gas flow rate, the mixing efficiency with the reactant gas such as $NH_3$ can be increased. Furthermore, by changing the conductance to the desired value, it is possible to generate a difference between the pressure inside the crucible and the pressure outside the crucible. By lowering (or raising) the internal crucible pressure, the evaporation amount of raw material (or dopant material) can be increased (or reduced), and the supply amount of raw material (or dopant material) in the crucible can then also be controlled by pressure rather than by temperature.

[2.2.2. First Crucible]

[A. First Crucible Structure]

A structure of the first crucible 42 is not particularly limited as long as the structure exhibits the above-described functions. In the example of FIG. 6, the first crucible 42 includes:

(a) an inner crucible 42a to hold the metal source 50, and an outer crucible 42b to accommodate the inner crucible 42a;

(b) a carrier gas channel 42c, which is provided between an outer wall surface of the inner crucible 42a and an inner wall surface of the outer crucible 42b so as to flow the carrier gas toward the inside of the inner crucible 42a, and (c) a carrier gas inlet 42d, which is provided in the bottom surface of the outer crucible 42b so as to introduce the carrier gas into the carrier gas channel 42c.

Although the carrier gas inlet 42d is provided in the bottom surface of the outer crucible 42b in the example of FIG. 6, it may be provided in the side surface of the outer crucible 42b.

The carrier gas channel 42c may be any channel that can flow the carrier gas toward the inside of the inner crucible 42a. However, if flow of the carrier gas in the inside of the inner crucible 42a is greatly away from the surface of the metal source 50, the discharge amount of metal-contained gas decreases. Hence, the carrier gas channel 42c is preferably capable of flowing the carrier gas toward the surface of the metal source 50, or capable of flowing the carrier gas along near the surface of the metal source 50.

To increase the discharge amount of the metal-contained gas without complicating the structure of the first crucible 42, the carrier gas channel 42c is preferably capable of flowing the carrier gas toward the top of the inner crucible 42a, and a carrier-gas flow direction adjuster 42e is preferably provided in the upper part of the outer crucible 42b so as to change a direction of the carrier gas flow to a direction toward the metal source 50 after the carrier gas flow has reached the top of the inner crucible 42a.

Optimizing a shape of the carrier gas channel 42c, which is formed in a gap between the inner crucible 42a and the outer crucible 42b, makes it possible to flow the carrier gas toward the top of the inner crucible 42a. The carrier-gas flow direction adjuster 42e may be any adjuster that can change the upward carrier gas flow to a downward or obliquely downward flow after the carrier gas flow has reached the top of the inner crucible 42a.

For example, as shown in FIG. 6, a cylindrical component (carrier-gas flow direction adjuster 42e) having an outer diameter smaller than the inner diameter of the inner crucible 42a is provided on the top of the outer crucible 42b. This makes it possible to change the vertically upward carrier gas flow to a vertically downward flow. When the flow direction of the carrier gas is changed to the vertically downward direction, the carrier gas is blown to the surface of the metal source 50 and changed into a mixed gas containing the metal-contained gas. The flow of the carrier gas (mixed gas) colliding with the surface of the metal source 50 is changed again to a vertically upward flow, and the mixed gas is discharged to the outside through the porous baffle plate 48.

[B. Material of First Crucible]

The material of the first crucible 42 is not particularly limited, and an optimum material can be selected according to types of the metal source 50.

Examples of the material of the first crucible 42 include graphite, SiC-coated graphite, pBN-coated graphite, and TaC-coated graphite. In order to grow the low impurity concentration drift layer in particular, TaC-coated graphite is preferably used for the first crucible 42.

[2.2.3. Carrier Gas Supply Unit]

The carrier gas supply unit supplies the carrier gas into the first crucible 42, and supplies the mixed gas of metal-contained gas and the carrier gas toward the seed crystal 22.

The structure of the carrier gas supply unit is not particularly limited, and the optimum structure can be selected according to the purpose. In the example of FIG. 6, the carrier gas supply unit has a piping 44 to flow the carrier gas, and one end of the piping 44 is coupled to the carrier gas inlet 42*d* of the outer crucible 42*b* and the other end thereof is coupled to a carrier gas supply source (not shown).

[2.2.4. Reactant Gas Supply Unit]

The reactant gas supply unit supplies the reactant gas toward the seed crystal 22. The reactant gas supply unit may supply only the reactant gas or may supply a mixture of the reactant gas and a diluent gas (carrier gas). Furthermore, when the dopant is a gas, the dopant can also be supplied by using the reactant gas supply unit.

The metal-contained gas and the reactant gas must be uniformly mixed near the surface of the seed crystal 22 to grow a single crystal including an inorganic compound on the surface of the seed crystal 22. The structure of the reactant gas supply unit is not particularly limited as long as the unit exhibits such a function. In the example of FIG. 6, the reactant gas supply unit has a piping 46 to supply the reactant gas, and one end of the piping 46 is inserted in the reaction container 26 and the other end thereof is coupled to a reactant gas supply source (not shown) and the diluent gas supply source (not shown).

The reactant gas supply unit is preferably capable of supplying the reactant gas toward the mixed gas to be discharged through the porous baffle plate 48. To achieve this, a reactant-gas-flow direction adjuster 52 is preferably provided between the susceptor 24 and the first crucible 42 to change the direction of the reactant gas flow to a direction toward the mixed gas to promote mixing of the mixed gas and the reactant gas.

For example, as shown in FIG. 6, when the susceptor 24 is separately disposed vertically above the first crucible 42, a hollow disc (reaction-gas-flow direction adjuster 52) is placed between the susceptor 24 and the first crucible 42. In such a case, the mixed gas of metal-contained gas and the carrier gas directly rises toward the seed crystal 22 through the through-holes of the porous baffle plate 48.

On the other hand, the reactant gas introduced into the reaction container 26 rises in the reaction container 26, and collides with the bottom surface of the hollow disc after passing along a lateral side of the first crucible 42. When the reactant gas collides with the bottom surface of the hollow disc, the flow direction of the reactant gas is changed to a horizontal direction (direction along the opening of the first crucible 42), and the reactant gas joins with the mixed gas above the porous baffle plate 48. The flow direction of such a joined gas (the mixture of the mixed gas and the reactant gas) is changed again at the opening of the hollow disc to a vertically upward direction, so that the joined gas is supplied to the surface of the seed crystal 22.

Although the reactant gas can be supplied to the surface of the seed crystal 22 even if the reactant-gas-flow direction adjuster 52 is not provided, the reactant-gas-flow direction adjuster 52 makes it possible to produce a joined gas having a uniform composition. In addition, the joined gas having a uniform composition is supplied to the surface of the seed crystal 22, resulting in stable growth of the single crystal.

[2.3. Heating Section]

[2.3.1. Heating Unit]

The heating section 60 includes a heating unit 62 to heat the seed crystal 22 (or the susceptor 24) and the metal source 50 (or the first crucible 42). The structure of the heating unit 62 is not particularly limited, and the optimum structure can be selected according to the purpose.

Examples of the heating unit 62 include, (a) a resistance heating unit to heat the seed crystal 22 and metal source 50 using a heater, and (b) a high frequency induction heating unit to heat the seed crystal 22 and metal source 50 using an RF coil.

Of these, the resistance heating unit heats not only the seed crystal 22 and the metal source 50 but also the reaction container 26 to isolate the seed crystal 22 and the metal source 50 from the open air. The resistance heating unit is therefore effective only when the growth temperature of the single crystal is lower than the heatproof temperature of the reaction container 26.

On the other hand, the high frequency induction heating unit can directly heat the seed crystal 22 and the metal source 50 without directly heating the reaction container 26 by optimizing the material of the reaction container 26. The high frequency induction heating unit is therefore particularly effective when the growth temperature of the single crystal is higher than the heatproof temperature of the reaction container 26.

The heating section 60 may include one or more heating units 62. Using a plurality of heating units 62 makes it easy to independently control the temperature of each section, but may complicate an apparatus structure, or may complicate active control of the temperature of each section.

On the other hand, using one heating unit 62 provides a relatively simple apparatus structure, but makes it difficult to actively control the temperature of each section. In such a case, the second movable unit 64 as described below is preferably used to control a position between the heating unit 62 and the first crucible 42.

[2.3.2. Second Movable Unit]

The heating unit 62 is disposed outside the reaction container 26 and around the seed crystal 22 and the first crucible 42. A distance between the heating unit 62 and the first crucible 42 (hereinafter referred to as "heating unit-to-crucible distance") may be fixed or variable.

The term "heating unit-to-crucible distance" means a distance (vertical distance) between a vertical reference point of the heating unit 62 (for example, a lower end of the RF coil having a center axis disposed vertically) and a vertical reference point of the first crucible 42 (for example, the surface of the metal source 50 in the first crucible 42).

When the heating unit-to-crucible distance is fixed, the temperature of each section may be gradually deviated from the optimum with growth of the single crystal, and thus successive growth may be difficult. Hence, when a thick single crystal is grown, the second movable unit 64 is preferably provided to change the vertical distance between the heating unit and the first crucible.

The second movable unit 64 may be provided in one or both of the heating section 60 and the gas supply section 40. That is, the second movable unit 64 may be any of:

(a) a unit capable of moving the heating unit 62 while the first crucible 42 is fixed, (b) a unit capable of moving the first crucible 42 while the heating unit 62 is fixed, or (c) a unit capable of moving both the heating unit 62 and the first crucible 42.

Temperature of each section is preferably actively controlled to stably continue growth of the single crystal. To achieve this, the second movable unit 64 is preferably capable of moving the heating unit 62.

[2.4. Control Section]

The HF-VPE device 10*a* has a control section (not shown) to control the temperature of the susceptor 24 (or growing crystal), the temperature of the first crucible 42, carrier gas flow rate, and the reactant gas flow rate. When the HF-VPE device 10a has the first movable unit 28, the second movable unit 64, or the angle changing unit 30, the control section further controls the operation of these units.

[2.5. Usage Method]

When the metal source 50 is placed into the first crucible 42 and heated to a predetermined temperature, metal vapor is generated. At the same time, when the reactant gas is supplied by using the reactant gas supply unit, an inorganic compound (a nitride semiconductor, for example) grows on the surface of the seed crystal 22 (or the substrate 102). At such time, when a raw material gas containing a donor is added to the reactant gas, an n-type layer can be formed. On the other hand, when a raw material gas containing an acceptor is added to the reactant gas, a p-type layer can be formed. Furthermore, when the raw material temperature, the temperature of the growth surface, and the temperature of the porous baffle plate are optimized, an inorganic compound with favorable quality can be formed.

[2.5.1. Raw Material]

For example, when the GaN is grown, metal Ga is preferably used as the metal source 50 and $NH_3$ is preferably used as the reactant gas. Furthermore, an inert gas such as $N_2$ or Ar is preferably used as the carrier gas for transporting the metal vapor and the reactant gas. However, when In is used as the metal source 50 or when Mg is used as the acceptor, these react with $N_2$. In such a case, a rare gas (He, Ar, Ne, Xe, or the like) is preferably used as the carrier gas.

For example, when Si is used as the donor, silane, monomethyl silane, or the like, is preferably used as the raw material gas containing the donor.

When Ge is used as the donor, germanium tetrachloride ($GeCl_4$), or the like, is preferably used as the raw material gas containing the donor.

Furthermore, when Mg is used as the acceptor, bis(cyclopentadienyl)magnesium ($Cp_2Mg$), or the like, is preferably used as the raw material gas containing the acceptor.

[2.5.2. Temperature]

The decomposition temperature of GaN is about 1200° C. When the temperature of the metal source 50 is equal to or less than the decomposition temperature of GaN, the metal Ga reacts with a small amount of the reactant gas intruded into the first crucible 42, and a passive film (a film having a low evaporation rate) is formed on the surface of the metal Ga. As a result, the growth rate decreases. The temperature of the metal source 50 is therefore preferably greater than 1200° C.

On the other hand, when the temperature of the metal source 50 is too high, the decomposition of the reactant gas advances excessively when the reactant gas has mixed with the carrier gas containing the metal vapor discharged from the first crucible 42. As a result, the substantial partial pressure of the reactant gas at the surface of the seed crystal 22 decreases. The temperature of the metal source 50 is therefore preferably less than 1350° C.

Furthermore, in the case of growing GaN, when the temperature of the growth section is too low, crystal quality deteriorates. The temperature of the growth section is therefore preferably greater than 1000° C.

On the other hand, when the temperature of the growth section is too high, the GaN layer thus grown decomposes and a Ga liquid film is generated. Therefore, the temperature of the growth section is preferably less than 1200° C.

Furthermore, in cases where the metal Ga is used as the metal source 50, when the temperature of the porous baffle plate 48 is too low, Ga droplets and GaN polycrystals adhere to the surface of the porous baffle plate 48. Hence, the temperature of the porous baffle plate 48 is preferably higher than the temperature of the metal source 50. The temperature of the porous baffle plate 48 is preferably at least +50° C. more than the temperature of the metal source 50.

The same is also true in cases where a nitride semiconductor other than GaN is grown, and it is preferable to control the temperature of each section based on the foregoing perspective.

[3. Halogen-Free Vapor Phase Epitaxy (HF-VPE) Device (2)]

Figure 7:
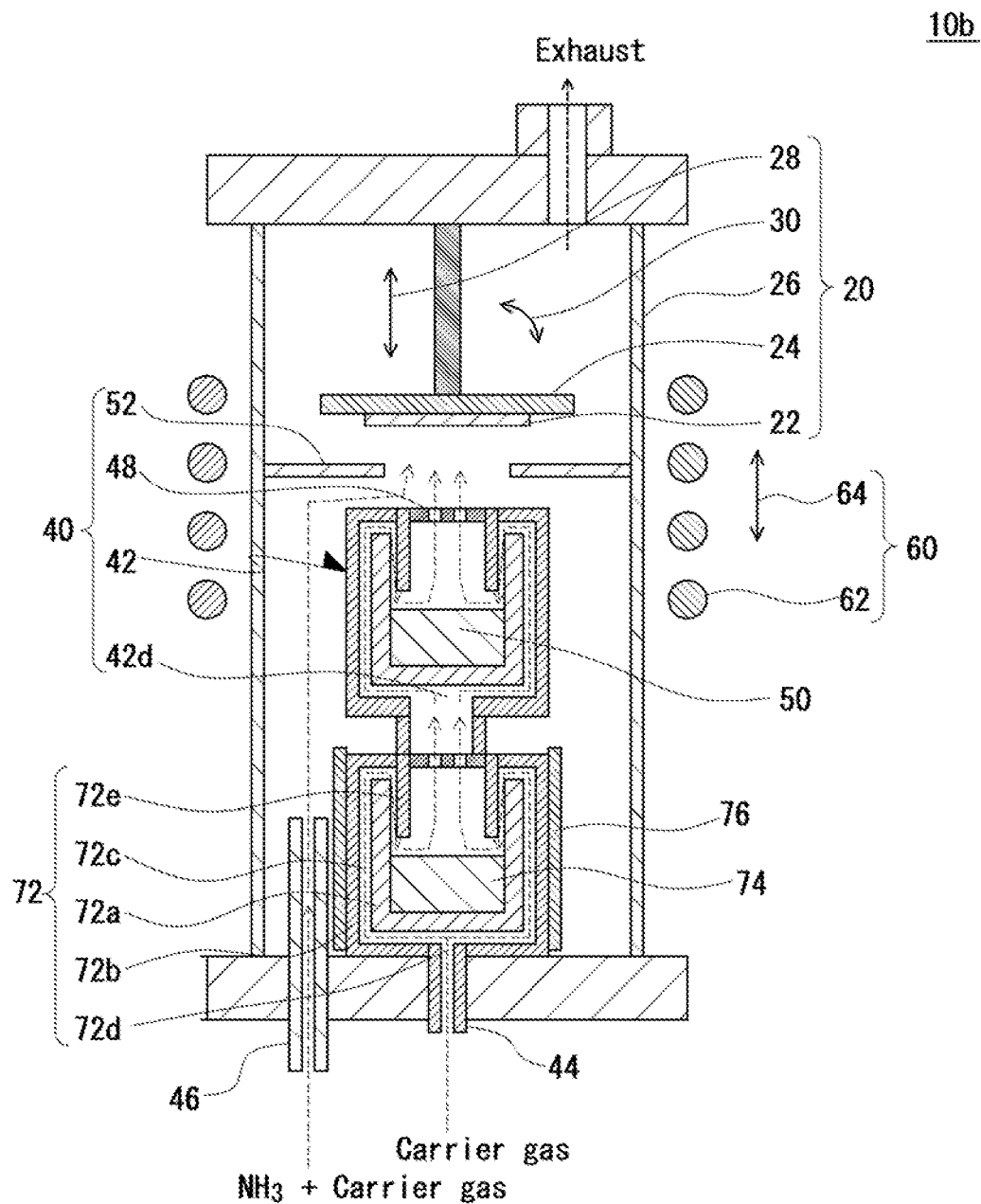
FIG. 7 is a cross-sectional schematic diagram of a halogen-free vapor phase epitaxy (HF-VPE) device according to the second embodiment of the present invention.

FIG. 7 shows a cross-sectional schematic diagram of an HF-VPE device according to a second embodiment of the present invention. In FIG. 7, an HF-VPE device 10b has the following configuration.

(1) The HF-VPE device 10b includes:

a crystal growth section 20 having a susceptor 24 for holding a seed crystal 22;

a gas supply section 40 to supply a metal-contained gas generated from a metal source 50 and a reactant gas, which reacts with the metal-contained gas to form an inorganic compound, toward the seed crystal 22; and a heating section 60 having a heating unit 62 to heat the seed crystal 22 and the metal source 50.

(2) The gas supply unit 40 includes:

a first crucible 42 disposed separately from the susceptor 24 and holding the metal source 50;

a carrier gas supply unit that supplies a carrier gas into the first crucible 42, and supplies a mixed gas of the metal-contained gas and the carrier gas toward the seed crystal 22; and a reactant gas supply unit to supply the reactant gas to the seed crystal 22.

(3) A porous baffle plate 48 is provided in the opening of the first crucible 42.

(4) The HF-VPE device 10b further includes:

a second crucible 72 for holding a donor raw material 74; and a heating unit 76 for heating the second crucible 72, wherein a carrier gas inlet 72d of the second crucible 72 is connected to the carrier gas supply unit, and the opening of the second crucible 72 is connected to the carrier gas inlet 42d of the first crucible 42.

[3.1. Second Crucible]

The second crucible 72 has the same structure as the first crucible 42 except that the second crucible 72 serves to hold the donor raw material 74. In other words, the second crucible 72 includes:

(a) an inner crucible 72a to hold the donor raw material 74, and an outer crucible 72b to accommodate the inner crucible 72a;

(b) a carrier gas channel 72c, which is provided between an outer wall surface of the inner crucible 72a and an inner wall surface of the outer crucible 72b so as to flow the carrier gas toward the inside of the inner crucible 72a; and (c) a carrier gas inlet 72d, which is provided in the bottom surface of the outer crucible 72b so as to introduce the carrier gas into the carrier gas channel 72c.

Furthermore, a carrier-gas flow direction adjuster 72e is provided in the upper part of the outer crucible 72b so as to change a direction of the carrier gas flow to a direction toward the donor raw material 74 after the carrier gas flow has reached the top of the inner crucible 72a.

[3.2. Donor Raw Material]

The second crucible 72 is filled with the solid donor raw material 74. The optimum donor raw material 74 is preferably selected according to the type of donor.

For example, when Si is used as the donor, a high-purity Si solid is preferably used as the donor raw material 74. In addition, when Ge is used as the donor, a high-purity Ge solid is preferably used as the donor raw material 74. To lower the impurities in the growing crystal, a solid raw material that does not contain chlorides is preferably used as the donor raw material 74.

[3.3. Heating Unit]

The saturated vapor pressure of Si can be estimated using an empirical formula (Antoine equation) of the following formula (1). Here, $P_{sat}$ is the saturated vapor pressure of Si, A, B, and C are constants intrinsic to material, and T is the absolute temperature.

$$P_{sat}=10^{A-B/T}/T^C \quad (1)$$

The same is also true in cases where Ge solids are used as the donor raw material 74, and the saturated vapor pressure of Ge can be calculated by using formula (1).

In cases where a nitride semiconductor is used for both the substrate and the drift layer, the donor impurity concentration or the acceptor impurity concentration of the drift layer is about $10^{16}$ cm$^{-3}$ to $10^{18}$ cm$^{-3}$ in many case, which is about six orders of magnitude lower than the impurity concentration of the substrate. In cases where high frequency induction heating is used for the heating of the second crucible 72, it is difficult to control the temperature in the low temperature range of 600° C. or lower. Accordingly, the supply amount of donor or acceptor sometimes exceeds the intended amount, whereby the intended donor impurity concentration or acceptor impurity concentration may not be obtained. In particular, as indicated in formula (1), the supply amount increases exponentially relative to a rise in crucible temperature. Accordingly, in cases where a donor raw material 74 that has a high saturated vapor pressure is volatilized, control of the temperature of the second crucible 72 is important. Therefore, resistance heating, which can easily control in the low temperature range, is preferably used for the heating unit 76 for heating the second crucible 72 holding the donor raw material 74.

[3.4. Crucible Placement]

When the first crucible 42 and second crucible 72 are arranged as illustrated in FIG. 7, the vapor of the metal source 50 and donor raw material 74 is supplied to the surface of the seed crystal 22. For example, when the temperature of the first crucible 42 is lower than that of the second crucible 72, the raw material (or doping impurity) gas evaporated in the second crucible 72 is cooled in the first crucible 42, and raw material (or doping impurity) droplets could potentially be formed. Hence, a high-temperature crucible is preferably disposed near the seed crystal 22, and a low-temperature crucible is preferably disposed on the carrier gas inflow side. Furthermore, the temperature of the raw materials (or dopant material) of each crucible is preferably determined by taking into account the supply amount based on the saturated vapor pressure at the respective temperatures of the raw material (or dopant material).

[3.5. Other Configurations]

Because the other features of the HF-VPE device 10b are the same as those of the HF-VPE device 10a according to the first embodiment, a description of such features is omitted.

[3.6. Usage Method]

When the metal source 50 is placed into the first crucible 42 and heated to a predetermined temperature, metal vapor is generated. At the same time, when the reactant gas is supplied by using the reactant gas supply unit, an inorganic compound (a nitride semiconductor, for example) grows on the surface of the seed crystal 22 (or the substrate 102). At such time, when the second crucible 72, filled with the solid donor raw material 74, is heated, a donor-containing vapor is generated and supplied to the first crucible 42. As a result, an n-type layer containing donor impurities can be formed on the surface of the seed crystal 22 (substrate 102).

Note that, when an acceptor raw material is placed into the second crucible 72 instead of the donor raw material 74, a p-type layer containing acceptor impurities can also be formed on the surface of the seed crystal 22 (substrate 102).

[4. Halogen-Free Vapor Phase Epitaxy (HF-VPE) Device (3)]

Figure 8:
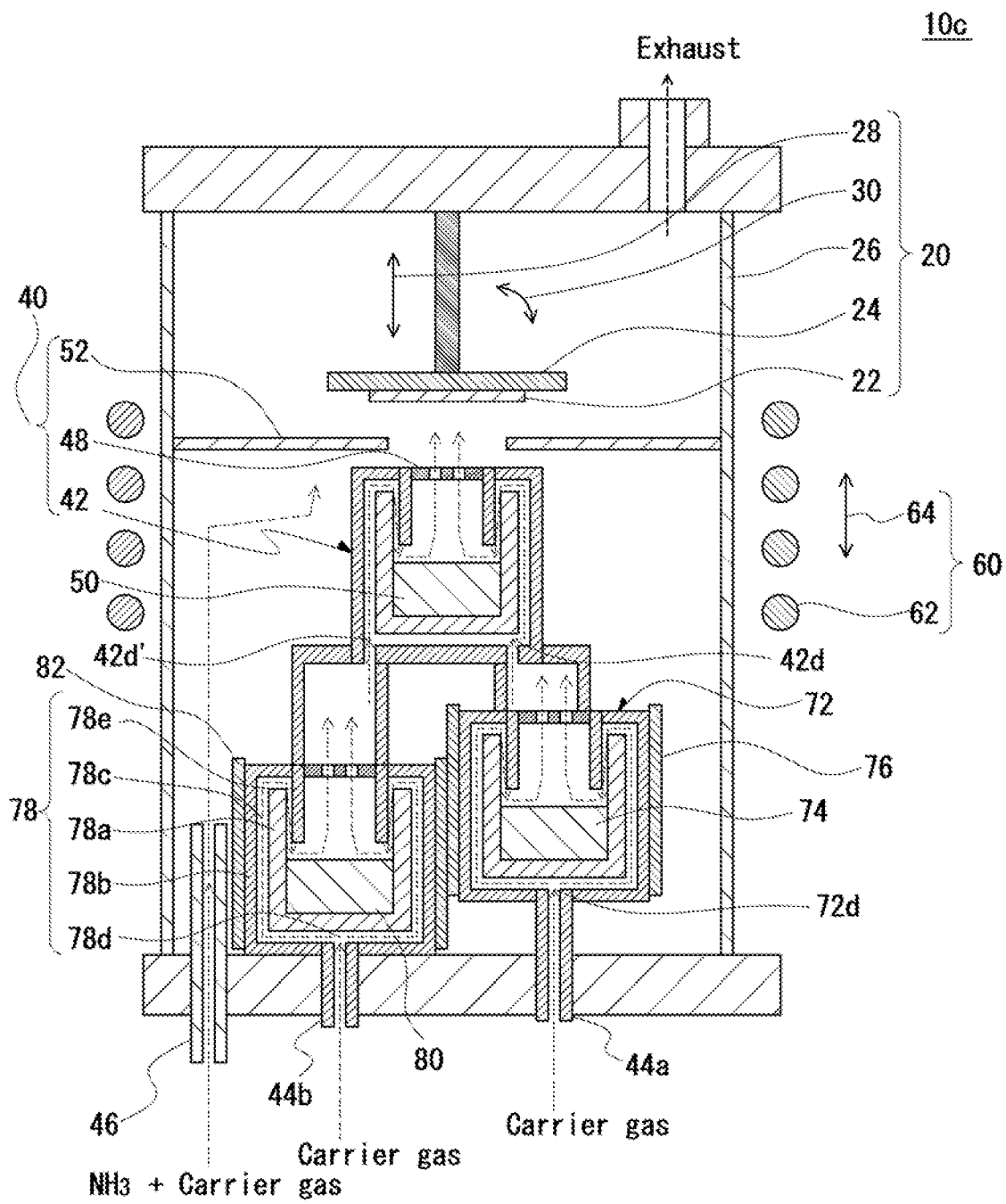
FIG. 8 is a cross-sectional schematic diagram of a halogen-free vapor phase epitaxy (HF-VPE) device according to the third embodiment of the present invention.

FIG. 8 shows a cross-sectional schematic diagram of an HF-VPE device according to a third embodiment of the present invention. In FIG. 8, an HF-VPE device 10c has the following configuration.

(1) The HF-VPE device 10c includes:
  a crystal growth section 20 having a susceptor 24 to hold a seed crystal 22;
  a gas supply section 40 to supply a metal-contained gas generated from a metal source 50 and a reactant gas, which reacts with the metal-containing gas to form an inorganic compound, toward the seed crystal 22; and
  a heating section 60 having a heating unit 62 to heat the seed crystal 22 and the metal source 50.

(2) The gas supply unit 40 includes:
  a first crucible 42 disposed separately from the susceptor 24 and holding the metal source 50;
  a carrier gas supply unit that supplies a carrier gas into the first crucible 42, and supplies a mixed gas of the metal-contained gas and the carrier gas toward the seed crystal 22; and
  a reactant gas supply unit to supply the reactant gas toward the seed crystal 22.

(3) A porous baffle plate 48 is provided in the opening of the first crucible 42.

(4) The HF-VPE device 10b further includes:
  a second crucible 72 for holding a donor raw material 74; and
  a heating unit 76 for heating the second crucible 72,
  wherein a carrier gas inlet 72d of the second crucible 72 is connected to the carrier gas supply unit, and
  the opening of the second crucible 72 is connected to the first carrier gas inlet 42d of the first crucible 42.

(5) The HF-VPE device 10b further includes:
  a third crucible 78 for holding an acceptor raw material 80; and
  a heating unit 82 for heating the third crucible 78,
  wherein a carrier gas inlet 78d of the third crucible 78 is connected to the carrier gas supply unit, and
  the opening of the third crucible 78 is connected to a second carrier gas inlet 42d' of the first crucible 42.

[4.1. Third Crucible]

The third crucible 78 has the same structure as the first crucible 42 and second crucible 72 except that the third crucible 78 serves to hold the acceptor raw material 80. In other words, the third crucible 78 includes:
  (a) an inner crucible 78a to hold the acceptor raw material 80, and an outer crucible 78b to accommodate the inner crucible 78a;
  (b) a carrier gas channel 78c, which is provided between an outer wall surface of the inner crucible 78a and an inner wall surface of the outer crucible 78b so as to flow the carrier gas toward the inside of the inner crucible 78a; and
  (c) a carrier gas inlet 78d, which is provided in the bottom surface of the outer crucible 78b so as to introduce the carrier gas into the carrier gas channel 78c.

Furthermore, a carrier-gas flow direction adjuster 78e is provided in the upper part of the outer crucible 78b so as to change a direction of the carrier gas flow to a direction toward the acceptor raw material 80 after the carrier gas flow has reached the top of the inner crucible 78a.

[4.2. Acceptor Raw Material]

The third crucible 78 is filled with the solid acceptor raw material 80. The optimum acceptor raw material 80 is preferably selected according to the type of acceptor.

For example, when Mg is used as the acceptor, a high-purity Mg solid is preferable used as the acceptor raw material 80. To lower the impurities in the growing crystal, the acceptor raw material 80 is preferably a solid raw material that does not contain chlorides.

[4.3. Heating Unit]

When Mg solids are used as the acceptor raw material 80, the saturated vapor pressure can be calculated using formula (1) above.

In addition, resistance heating, which can easily control in the low temperature range, is preferably used for the heating unit 82 for heating the third crucible 78, for the same reason as the solid donor raw material 74.

Note that Mg forms $Mg_3N_2$ by reacting with $N_2$ at 800° C. or less. When $Mg_3N_2$ is formed on the surface of the Mg raw material, the Mg supply amount deviates significantly from the amount calculated using formula (1). Therefore, a rare gas is preferably used rather than $N_2$ gas as the carrier gas for supplying Mg.

[4.4. Crucible Placement]

In the HF-VPE device 10c illustrated in FIG. 8, the second crucible 72 and third crucible 78 are connected in parallel to the first crucible 42. Therefore, either the vapor of the donor raw material 74 or the vapor of the acceptor raw material 80 can be supplied to the first crucible 42.

[4.5. Other Configurations]

Because the other features of the HF-VPE device 10c are the same as those of the HF-VPE devices 10a and 10b according to the first and second embodiments, a description of such features is omitted.

[4.6. Usage Method]

When the metal source 50 is placed into the first crucible 42 and heated to a predetermined temperature, metal vapor is generated. At the same time, when the reactant gas is supplied by using the reactant gas supply unit, an inorganic compound (a nitride semiconductor, for example) grows on the surface of the seed crystal 22 (or the substrate 102). At such time, when the second crucible 72, filled with the solid donor raw material 74, is heated, a donor-contained vapor is generated and supplied to the first crucible 42. As a result, an n-type layer containing donor impurities can be formed on the surface of the seed crystal 22 (substrate 102).

Meanwhile, when the third crucible 78, filled with the solid acceptor raw material 80, is heated, an acceptor-contained vapor is generated and supplied to the first crucible 42. As a result, a p-type layer containing acceptor impurities can be formed on the surface of the seed crystal 22 (substrate 102).

[5. Method for Manufacturing Semiconductor Device]

The method for manufacturing the semiconductor device according to the present invention includes:

a first step of using a halogen-free vapor phase epitaxy (HF-VPE) device and forming, on a substrate surface, either:

(a) an n-type layer including a nitride semiconductor (A) in which the concentration of donor impurities (excluding O) is $1\times10^{15}$ cm$^{-3}$ or more and $1\times10^{20}$ cm$^{-3}$ or less; the concentration of C impurities is $1\times10^{16}$ cm$^{-3}$ or less; the concentration of O impurities is $1\times10^{16}$ cm$^{-3}$ or less; the concentration of Ca impurities is $1\times10^{16}$ cm$^{-3}$ or less; and the sum total of the concentrations of the C impurities, the O impurities, and the Ca impurities is lower than the concentration of the donor impurities, or (b) a p-type layer including a nitride semiconductor (C) of the same type as or of a different type from the nitride semiconductor (A) constituting the n-type layer and in which the concentration of acceptor impurities (excluding C and Ca) is $1\times10^{15}$ cm$^{-3}$ or more and $1\times10^{20}$ cm$^{-3}$ or less; the concentration of C impurities is $1\times10^{16}$ cm$^{-3}$ or less; the concentration of O impurities is $1\times10^{16}$ cm$^{-3}$ or less; the concentration of Ca impurities is $1\times10^{16}$ cm$^{-3}$ or less; and the sum total of the concentrations of the C impurities, the O impurities, and the Ca impurities is lower than the concentration of the acceptor impurities; and a second step of also forming, in the HF-VPE device, the p-type layer or the n-type layer on the surface of the substrate on which the n-type layer or the p-type layer has been formed, continuously and without exposing the substrate to the atmosphere.

The HF-VPE device according to the present invention does not substantially cause any contamination of the growing crystal with C, O, or Ca impurities. Further, both a p-type layer and an n-type layer can be grown continuously without exposure to the atmosphere. Moreover, high-speed growth of at least 10 μm/h is possible.

Hence, by using an HF-VPE device, it is possible to fabricate:

(a) a semiconductor device including an n-type layer (drift layer) in which the concentration of donor impurities is relatively low and the concentration of C, O, and Ca impurities is lower than conventionally;

(b) a semiconductor device including a p-n junction that does not include an Si segregation region and/or a Ca segregation region at the interface between the p-type layer and n-type layer, or (c) a semiconductor device including an n-type layer (drift layer) with a high breakdown voltage.

[6. Effect]

When HF-VPE is used, it is easy to control the free electron concentration of a low-concentration n-type drift layer without contamination with C, H, or O impurities derived from the device or raw material. Furthermore, because the HF-VPE can form both n-type layer and p-type layer each composed of the nitride semiconductor, there is no need for exposure to the atmosphere after growing the n-type layer and before forming the p-type layer (or after growing the p-type layer and before forming the n-type layer). Therefore, formation of an unintended Si segregation region or a Ca segregation region at the interface between the n-type layer and the p-type layer can be suppressed, and a p-n junction with ideal characteristics can be fabricated.

An n-type drift layer that includes a nitride semiconductor and has a low concentration (up to $1\times10^{17}$ cm$^{-3}$) is used in power semiconductor devices. An n-type drift layer obtained by using conventional methods is inevitably contaminated with C and O impurities derived from its growth methods. For the nitride semiconductor constituting the n-type layer, C impurities act as compensation acceptors (that have the effect of reducing the free electron concentration), and O impurities act as donors (that have the effect of increasing the free electron concentration). Hence, it is difficult to control the free electron concentration of a low-concentration n-type drift layer as designed by using conventional growth methods.

HF-VPE according to the present invention enables growth of a nitride semiconductor that has minimal impurities in comparison with conventional growth methods. Therefore, C, H, O, and Ca impurities can be suppressed to levels identical to background levels in SIMS analysis. It is thus also possible to fabricate a low-concentration n-type drift layer that has a free electron concentration as designed.

Moreover, unlike the commonly used hydride vapor phase epitaxy (HVPE), the HF-VPE can easily grow not only an n-type layer but also of an Mg-doped p-type layer. Hence, the HF-VPE allows continuous growth of the n-type layer and the p-type layer, thereby avoiding the adhesion of Si impurities to the surface due to exposure to the atmosphere. Furthermore, this makes it possible to fabricate a p-n junction that does not contain spike-shaped Si impurities at the p-n interface.

The p-n junction is a basic structure of a semiconductor electronic device such as a diode or a MOSFET. The quality of a p-n junction greatly affects the performance of the device being fabricated, and hence there is a need for technology that enables a p-n junction as designed to be fabricated at a high yield and at a high speed (of at least 10 μm/h). In the HF-VPE as illustrated in FIG. 8, for example, the n-type layer and the p-type layer each composed of the nitride semiconductor can be grown continuously (without exposure to the atmosphere) by using a first crucible (raw material crucible) and the second and third crucibles (impurity-doped crucibles).

Because the n-type layer and p-type layer can be grown continuously, it is possible to suppress segregation at the interface of the p-n junction due to exposure to the atmosphere (Si segregation at a concentration of about $5\times10^{18}$ $cm^{-3}$ or Ca segregation at a concentration of about $1\times10^{16}$ $cm^{-3}$ or more).

In the case of using HYPE, it is difficult to growth a p-type GaN layer. Hence, after growing an n-type drift layer, it is necessary to expose the n-type drift layer to the atmosphere and fabricate the p-n junction using a device capable of forming the p-type layer such as MOCVD. As a result, when a surface is exposed to the atmosphere, Si and Ca impurities inevitably segregate on the exposed surface.

Further, in the case of using MOCVD, both a p-type GaN layer and an n-type GaN layer can be grown continuously without exposure to the atmosphere. However, because contamination with C impurities, which are derived from the organometallic raw material used as the raw material, is inevitable, it is not possible to fabricate a drift layer free from C impurity. Furthermore, the growth rate is also on the order of 10 μm/h at maximum. Therefore, from the viewpoint of cost and productivity, it is not realistic to use the MOCVD for growth of a drift layer having a thickness of about 10 μm used for a power device, because a long growth time is required.

Further, in the case of using MBE, both a p-type GaN layer and an n-type GaN layer can be grown continuously without exposure to the atmosphere. However, in the MBE, contamination of Ca impurities from the crucible is unavoidable. Furthermore, the growth rate is about 1 μm/h at maximum. Therefore, from the viewpoint of cost and productivity, it is not realistic to use the MBE for growing a drift layer having a thickness of about 10 μm used for a power device, because a long growth time is required.

In contrast, HF-VPE makes it possible to fabricate a p-n junction having a concentration as designed with high yield and at high speed (of at least 10 μm/h), as illustrated in table 1. Furthermore, both a p-type layer and an n-type layer can be fabricated, and thus unintended impurities can be reduced as far as possible.

TABLE 1

|  | HF-VPE | HVPE | MOCVD | MBE |
|---|---|---|---|---|
| Growth fee from C impurities | ○ | ○ | x | ○ |
| Growth of p-type GaN | ○ | x | ○ | ○ |
| Growth rate of 10 μm/h or more | ○ | ○ | Δ | x |

○: Easy to perform,
Δ: Can be performed but with problems,
x: Difficult to preform

EXAMPLES

Example 1

[1. Sample Preparation]

By using the HF-VPE device 10*b* illustrated in FIG. 7, an Si-doped n-type GaN layer was grown. The metal Ga was placed into an inner crucible 42*a* of the first crucible 42 (material: TaC-coated graphite), a carrier gas ($N_2$) was made to flow between the inner crucible 42*a* and the outer crucible 42*b*, and Ga vapor was transported to the seed crystal 22 (substrate 102). Furthermore, $NH_3$ diluted in $N_2$ was used as the reactant gas.

The flow rate of the carrier gas ($N_2$) was set to 1 slm, the flow rate of $NH_3$ was set to 4 slm, the flow rate of the dilution gas ($N_2$) was set to 1 slm, and the pressure was set to 2 kPa. The temperature of the metal source 50 was set to 1300° C. and the temperature of the susceptor 24 was set to 1100° C.

Si was placed into the second crucible 72. Si impurities were supplied so that the Si impurity concentration of the n-type layer was $1\times10^{17}$ $cm^{-3}$. The temperature of the second crucible 72 was set to 1000 to 1100° C. The growth rate under these growth conditions was high at about 100 μm/h. Hence, it was possible to grow the thick draft layer (10 μm) required for a power device with a breakdown voltage of 1200 V in a short time period of about six minutes.

[2. Evaluation]

Figure 9:
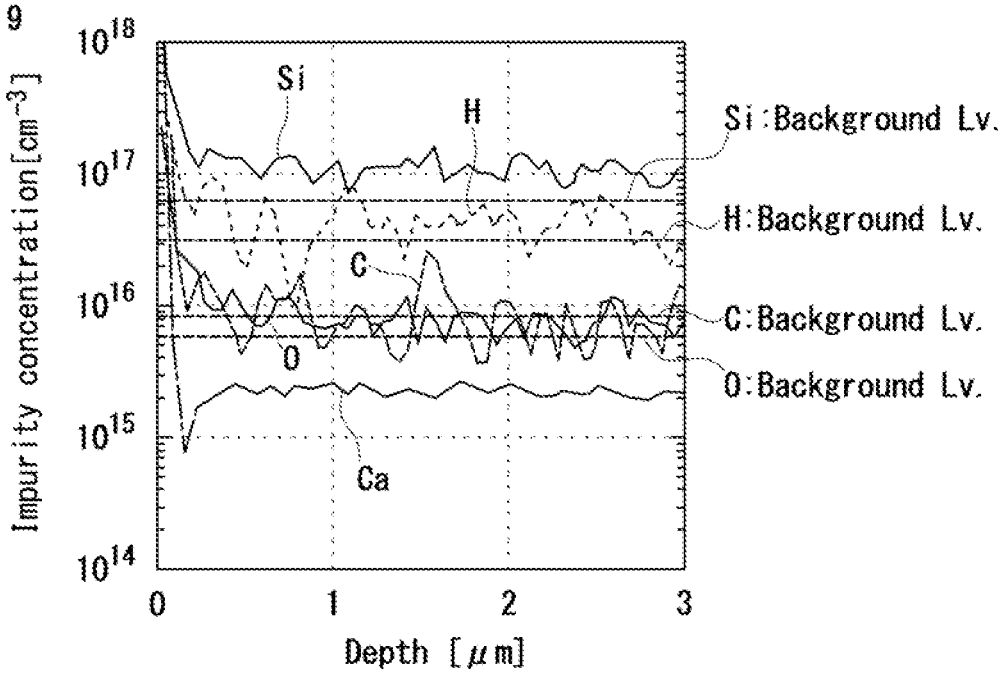
FIG. 9 is SIMS analysis results for impurity concentrations in a n-type drift layer fabricated using HF-VPE.

FIG. 9 shows SIMS analysis results for impurity concentrations in the n-type drift layer fabricated using HF-VPE. As can be confirmed from FIG. 9, the n-type drift layer having an Si impurity concentration of about $1\times10^{17}$ $cm^{-3}$ could be grown uniformly. Moreover, in the case of HF-VPE, hydrogen chloride (HCl) gas, which readily corrodes members inside the growth device, is not used as the gas for growth. Furthermore, because an organometallic compound is not used as the group-III raw material, contamination with C, H, and O impurities from the device members or raw material can be reduced as far as possible. Hence, the concentration of C, H, and O impurities were at SIMS analysis background levels or less.

The free electron concentration obtained by Hall measurement was $1\times10^{17}$ $cm^{-3}$ and was identical to the Si impurity concentration. Therefore, it is not found a deviation between the designed free electron concentration and the actual free electron concentration due to impurities such as C, O, and Ca.

Although the concentration of Ca impurities was about $2\times10^{15}$ $cm^{-3}$ under these growth conditions, it has been confirmed that the concentration can be reduced to SIMS background levels or less depending on the growth conditions. It was confirmed that the concentration of Ca impurities was about two orders of magnitude smaller than $1\times10^{17}$ $cm^{-3}$, which is the target free electron concentration of the drift layer, and did not affect the free electron concentration. The concentration of Ca impurities is also required to be $1\times10^{16}$ cm$^{-3}$ or less, which is about one order of magnitude lower than $1\times10^{17}$ cm$^{-3}$.

Example 2, Comparative Examples 1 and 2

[1. Sample Preparation]

An n-GaN layer was formed by using various growth methods. As the growth methods, HF-VPE (Example 2), HYPE (Comparative Example 1), and MOCVD (Comparative Example 2) were used.

[2. Evaluation]

Figure 10:
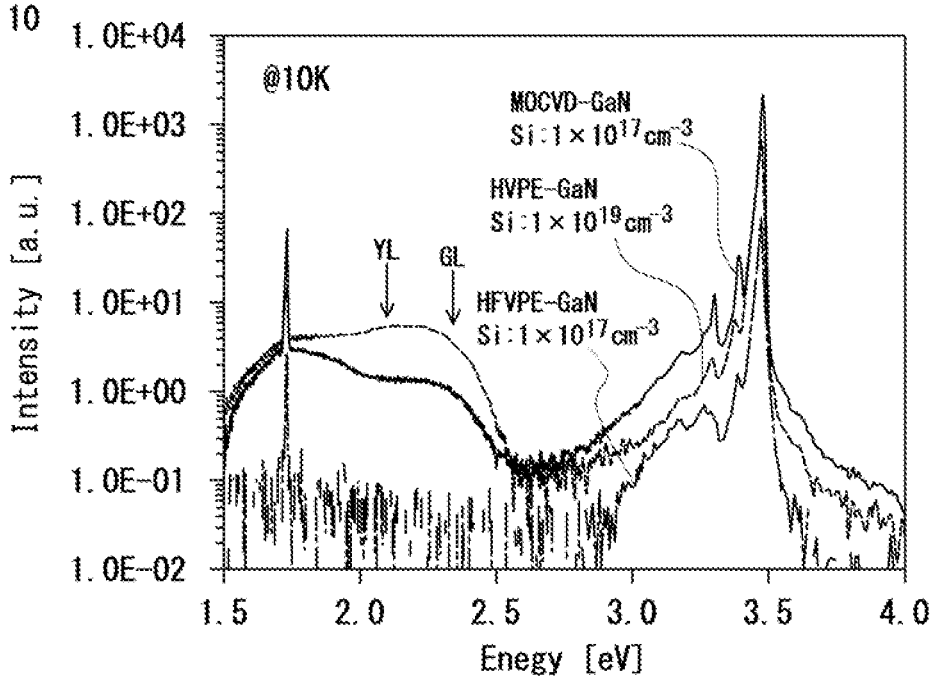
FIG. 10 is low-temperature cathode-luminescence analysis results for n-GaN layers grown using various growth methods.

A low-temperature cathode luminescence (CL) analysis of the n-GaN layer was performed and a spectrum evaluation was carried out. The acceleration voltage was set to 5 kV or 10 kV. FIG. 10 shows low-temperature cathode-luminescence analysis results for n-GaN layers grown using various growth methods.

YL and GL, which is luminescence caused by impurity-induced defects, were confirmed for the n-GaN layers grown using HVPE and MOCVD. On the other hand, no YL or GL was confirmed for the n-GaN layer grown using HF-VPE. In other words, it indicates that the HF-VPE allows the growth of very high-purity GaN, so that the GaN obtained by the HF-VPE has very low density of defect level formed by impurities.

Although embodiments of the present invention have been described in detail hereinabove, the present invention is not limited to the foregoing embodiments, rather, various modifications can be made within a scope not departing from the spirit of the present invention.

The semiconductor device according to the present invention can be used as a Schottky diode, a p-n junction diode, a pin diode, or a vertical MOSFET, or the like.

What is claimed is:

1. A semiconductor device comprising:
a substrate;
an n-type layer including a nitride semiconductor (A) formed on the surface of the substrate; and
a p-type layer formed adjacent to an upper surface or a lower surface of the n-type layer, wherein
in the n-type layer,
a concentration of donor impurities (excluding O) is $1\times10^{15}$ cm$^{-3}$ or more and $1\times10^{20}$ cm$^{-3}$ or less,
a concentration of C impurities is $1\times10^{16}$ cm$^{-3}$ or less,
a concentration of O impurities is $1\times10^{16}$ cm$^{-3}$ or less,
a concentration of Ca impurities is $1\times10^{16}$ cm$^{-3}$ or less, and
a sum total of the concentrations of the C impurities, the O impurities, and the Ca impurities is lower than the concentration of the donor impurities
the p-type layer includes a nitride semiconductor (C) of a same type as or of a different type from the nitride semiconductor (A) constituting the n-type layer, in which
a concentration of acceptor impurities (excluding C and Ca) is $1\times10^{15}$ cm$^{-3}$ or more and $1\times10^{20}$ cm$^{-3}$ or less,
a concentration of C impurities is $1\times10^{16}$ cm$^{-3}$ or less,
a concentration of O impurities is $1\times10^{16}$ cm$^{-3}$ or less,
a concentration of Ca impurities is $1\times10^{16}$ cm$^{-3}$ or less, and
a sum total of the concentrations of the C impurities, the O impurities, and the Ca impurities is lower than the concentration of the acceptor impurities,
the surface of the n-type layer on the p-type layer side does not include an Si segregation region in which the Si concentration is two times or more the concentration of the Si in the n-type layer, and
the surface of the n-type layer on the p-type layer side does not include a Ca segregation region in which the Ca concentration is $1\times10^{16}$ cm$^{-3}$ or more.

2. The semiconductor device according to claim 1, wherein the concentration of the donor impurities in the n-type layer is $5\times10^{15}$ cm$^{-3}$ or more and $1\times10^{18}$ cm$^{-3}$ or less.

3. The semiconductor device according to claim 1, wherein the nitride semiconductor (A) includes GaN, and the donor impurities include Si and/or Ge.

4. The semiconductor device according to claim 1, wherein the thickness of the n-type layer is 3 μm or more.

5. The semiconductor device according to claim 1, wherein the substrate includes:
(a) sapphire;
(b) SiC; or
(c) a nitride semiconductor (B) of a same type as or of a different type from the nitride semiconductor (A) constituting the n-type layer.

6. The semiconductor device according to claim 5, wherein the nitride semiconductor (B) includes GaN.

7. The semiconductor device according to claim 1, wherein the nitride semiconductor (C) includes GaN, and the acceptor impurities include Mg.

8. The semiconductor device according to claim 1, further comprising:
an i-type layer formed between the n-type layer and the p-type layer,
wherein the i-type layer incudes a nitride semiconductor (D) of the same type as or of a different type from the nitride semiconductor (A) constituting the n-type layer, and in which the concentration of the donor impurities is at least two orders of magnitude lower than the n-type layer and the concentration of the acceptor impurities is at least two orders of magnitude lower than the p-type layer.

9. The semiconductor device according to claim 8, wherein the nitride semiconductor (D) includes GaN.

10. A method for manufacturing the semiconductor device of claim 1, comprising:
a first step of using a halogen-free vapor phase epitaxy (HF-VPE) device and forming, on a substrate surface, either:
(a) an n-type layer including a nitride semiconductor (A) in which a concentration of donor impurities (excluding O) is $1\times10^{15}$ cm$^{-3}$ or more and $1\times10^{20}$ cm$^{-3}$ or less, a concentration of C impurities is $1\times10^{16}$ cm$^{-3}$ or less, the concentration of O impurities is $1\times10^{16}$ cm$^{-3}$ or less, a concentration of Ca impurities is $1\times10^{16}$ cm$^{-3}$ or less, and a sum total of the concentrations of the C impurities, the O impurities, and the Ca impurities is lower than the concentration of the donor impurities, or
(b) a p-type layer including a nitride semiconductor (C) of a same type as or of a different type from the nitride semiconductor (A) constituting the n-type layer, in which a concentration of acceptor impurities (excluding C and Ca) is $1\times10^{15}$ cm$^{-3}$ or more and $1\times10^{20}$ cm$^{-3}$ or less, a concentration of C impurities is $1\times10^{16}$ cm$^{-3}$ or less, a concentration of O impurities is $1\times10^{16}$ cm$^{-3}$ or less, a concentration of Ca impurities is $1\times10^{16}$ cm$^{-3}$ or less, and a sum total of the concentrations of the C impurities, the O impurities, and the Ca impurities is lower than the concentration of the acceptor impurities, and a second step of also forming, in the HF-VPE device, the p-type layer or the n-type layer on the surface of the substrate on which the n-type layer or the p-type layer has been formed, continuously without exposing the substrate to the atmosphere, wherein the HF-VPE device includes:

a crystal growth section having a susceptor to hold a substrate;

a gas supply section to supply a metal-contained gas (gas containing a metal vapor) generated from a metal source and a reactant gas, the reactant gas reacting with the metal-contained gas to form an inorganic compound, toward the substrate; and a heating section having a heating unit to heat the substrate and the metal source, wherein the gas supply section includes:

a first crucible disposed separately from the susceptor and holding the metal source;

a carrier gas supply unit that supplies a carrier gas into the first crucible, and supplies a mixed gas of the metal-contained gas and the carrier gas toward the substrate; and a reactant gas supply unit to supply the reactant gas toward the substrate, and wherein a porous baffle plate is provided in the opening of the first crucible.

11. The method for manufacturing a semiconductor device according to claim 10, wherein the nitride semiconductor (A) and the nitride semiconductor (C) each include GaN, the donor impurities include Si and/or Ge, and the acceptor impurities include Mg.

12. The method for manufacturing a semiconductor device according to claim 10, further comprising a third step between the first step and the second step, the third step forming an i-type layer, wherein the i-type layer includes a nitride semiconductor (D) of a same type as or of a different type from the nitride semiconductor (A) constituting the n-type layer, in which the concentration of the donor impurities is at least two orders of magnitude lower than the n-type layer and the concentration of the acceptor impurities is at least two orders of magnitude lower than the p-type layer.

13. The method for manufacturing a semiconductor device according to claim 12, wherein the nitride semiconductor (D) includes GaN.

\* \* \* \* \*